United States Patent
FuKamura et al.

(10) Patent No.: US 6,627,872 B1
(45) Date of Patent: Sep. 30, 2003

(54) SEMICONDUCTOR OPTICAL SENSING APPARATUS WITH RELIABLE FOCUSING MEANS AND CASING STRUCTURE

(75) Inventors: Hajime FuKamura, Nagano (JP); Akio Izumi, Nagano (JP); Nobuo Hirata, Nagano (JP); Osamu Sugiyama, Nagano (JP)

(73) Assignee: Fuji Electric Co., Ltd., Kawasaki (JP);

( * ) Notice: Subject to any disclaimer, the term of this patent is extended or adjusted under 35 U.S.C. 154(b) by 0 days.

(21) Appl. No.: 09/455,937

(22) Filed: Dec. 7, 1999

(30) Foreign Application Priority Data

Dec. 9, 1998 (JP) .......................................... 10-349423

(51) Int. Cl.⁷ ................................................. H01J 5/02
(52) U.S. Cl. .................... 250/239; 250/216; 250/208.1; 257/680
(58) Field of Search ............................. 250/239, 208.1, 250/214.1, 216; 287/680, 687, 729, 791, 681; 438/64, 116

(56) References Cited

U.S. PATENT DOCUMENTS

| | | | | |
|---|---|---|---|---|
| 4,766,095 A | * | 8/1988 | Hiroshi | ........................ 437/217 |
| 5,324,888 A | * | 6/1994 | Tyler et al. | ................. 174/52.2 |
| 5,734,155 A | * | 3/1998 | Rostoker | .................. 250/208.1 |
| 5,981,945 A | * | 11/1999 | Spaeth et al. | ................ 250/239 |
| 6,121,675 A | * | 9/2000 | Fukamura et al. | ........... 257/680 |

FOREIGN PATENT DOCUMENTS

JP          61-214566          9/1986

* cited by examiner

Primary Examiner—Kevin Pyo
Assistant Examiner—Seung C. Sohn
(74) Attorney, Agent, or Firm—Kanesaka & Takeuchi

(57) ABSTRACT

A semiconductor optical sensing apparatus is formed of a casing made of an electrically insulative material and having at least one opening at a bottom portion; a wiring device extending from an inside to an outside of the casing; a semiconductor optical sensor chip bonded to the bottom portion of the casing; and a connecting device for connecting a terminal of the sensor chip and the wiring device. A transparent filler is filled in a space inside the casing to cover the sensor chip, wherein the opening absorbs a volume change of the transparent filler caused by expansion or contraction thereof. A focusing device is connected to the casing and located at a position to focus an image on the sensor chip. The focusing device and casing are made of the same material or materials having substantially same thermal expansion coefficients. The semiconductor apparatus has a simple structure less affected by temperature variations and facilitates preventing deterioration and variation of optical characteristics, elongating life and improving reliability of the apparatus.

7 Claims, 22 Drawing Sheets

SEMICONDUCTOR OPTICAL SENSING APPARATUS WITH RELIABLE FOCUSING MEANS AND CASING STRUCTURE

BACKGROUND OF THE INVENTION AND RELATED ART STATEMENT

The present invention relates to a semiconductor optical sensing apparatus including a semiconductor optical sensor chip.

The conventional semiconductor optical sensing apparatus includes a semiconductor optical sensor chip, such as a charge coupled device (CCD) and a metal oxide semiconductor (MOS) device, enclosed in a ceramic casing for practical use. The semiconductor optical sensor chip detects an image or images focused onto it through an aspherical glass lens.

FIG. 20(a) is a plan view of a conventional semiconductor optical sensing apparatus. FIG. 20(b) is a cross sectional view taken along line 20b—20b of FIG. 20(a). FIG. 21(a) is a plan view of another conventional semiconductor optical sensing apparatus. FIG. 21(b) is a cross sectional view taken along line 21b—21b of FIG. 21(a). FIG. 22(a) is a plan view of a further conventional semiconductor optical sensing apparatus. FIG. 22(b) is a cross sectional view taken along line 22b—22b of FIG. 22(a).

In these figures, the optical sensing apparatus includes a sensor chip, an aspherical glass lens combined with the sensor chip and a ceramic casing that houses the sensor chip and the aspherical glass lens. The sensor chip may be a CCD image sensor, an MOS image sensor, a photodiode, an ultraviolet ray sensor or other optical sensors.

Referring now to FIGS. 20(a) and 20(b), the semiconductor optical sensing apparatus includes a detecting section and an optical section. The detecting section includes a semiconductor optical sensor chip 111, a ceramic casing 112, lead frames 113, bonding wires 114 and a transparent plate 116. The sensor chip 111 is die-bonded to the casing 112. The lead frames 113 include lead pins. The bonding wires 114 connect the internal terminals of the sensor chip 111 and the lead frames 113. The transparent plate 116 is fixed to the open end of the casing 112 with a layer 115 of glass having a low melting point or of adhesive.

The sensor chip 111 is mounted on the inner bottom face of the casing 112 and sealed in the casing 112 by the transparent plate 116. The space enclosed by the casing 112 and the transparent plate 116 is filled with a transparent filler (not shown) or with gas. The detecting section is fixed to a printed circuit board 117 by soldering the lead frames 113 to the printed circuit board 117.

The optical section includes an aspherical glass lens 118, a lens fixing frame 120 and a pressing metal jig 121. The lens fixing frame 120 is fixed to the printed circuit board 117 with an adhesive 119 so that the aspherical glass lens 118 may focus an image or images onto the sensor chip 111. The pressing metal jig 121 fixes the aspherical glass lens 118 to the lens fixing frame 120.

The semiconductor optical sensing apparatus thus constructed detects an image or images focused by the aspherical glass lens 118 on the sensor chip 111 through the transparent plate 116, and outputs the detected image signals through the lead frames 113. The semiconductor optical sensing apparatus works as an image sensor.

Referring now to FIGS. 21(a) and 21(b), the semiconductor optical sensing apparatus includes an optical section, that is different from the optical section of the semiconductor optical sensing apparatus shown in FIGS. 20(a) and 20(b). In FIGS. 21(a) and 21(b), the optical section includes an aspherical glass lens 118, a lens fixing frame 124 and a pressing metal jig 125. The lens fixing frame 124 is fixed to the printed circuit board 117 by frame support columns 122 and screws 123 so that the aspherical glass lens 118 may focus an image or images onto the sensor chip 111. The pressing metal jig 125 fixes the aspherical glass lens 118 to the lens fixing frame 124.

Referring now to FIGS. 22(a) and 22(b), the semiconductor optical sensing apparatus includes an optical section different from the optical section of the semiconductor optical sensing apparatus shown in FIGS. 20(a) and 20(b). The semiconductor optical sensing apparatus of FIGS. 22(a) and 22(b) is different from the optical sensing apparatus of FIGS. 20(a) and 20(b) in that the detecting section and the optical section are integrated together in FIGS. 22(a) and 22(b).

In FIGS. 22(a) and 22(b), the optical section includes an aspherical glass lens 118, a lens fixing frame 126, an adhesive layer 127 and a pressing metal jig 128. The aspherical glass lens 118 is mounted on the lens fixing frame 126. The adhesive layer 127 bonds the lens fixing frame 126 to the transparent plate 116 of the detecting section. The pressing metal jig 128 fixes the aspherical glass lens 118 to the lens fixing frame 126. The aspherical glass lens 118 is positioned so that the aspherical glass lens 118 may focus an image or images onto the sensor chip.

When the space inside the casing 112 is filled with gas, the surface of the semiconductor optical sensor chip and the bonding wires 114 are deteriorated depending on the gas in the sealed casing 112. For avoiding the deterioration, it is necessary to fill the space inside the casing 112 with an inert gas. The filling of the space inside the casing 112 with the inert gas increases manufacturing steps. Even when the space inside the casing 112 is filled with the inert gas, it is necessary to control the temperature and humidity precisely so that the characteristics of the semiconductor optical sensing apparatus may not change. Moreover, the gas leakage test, that should be conducted after the space inside the casing 112 is filled with the inert gas, increases the manufacturing cost.

When the space inside the casing 112 is filled with a transparent filler (not shown) to protect the sensor chip 111 and to seal the casing 112, the transparent filler expands or contracts due to temperature variations around and inside the casing 112. The expansion and contraction of the filler cause parting between the casing 112 and the filler, bubbles in the filler, and in the worst case, breaking of the bonding wires 114. The expansion and contraction of the filler due to temperature variations change the distance between the upper surface of the transparent plate 116 and the surface of the sensor chip 111. The distance change further causes variation of the optical characteristics of the semiconductor optical sensing apparatus.

In the conventional CCD image pick-up apparatuses and the conventional MOS image pick-up apparatuses, a ceramic casing is combined with an aspherical glass lens to prevent the displacement of the focal point due to temperature variations. As shown in FIGS. 20(a) through 22(b), one or more aspherical glass lenses 118 are mounted on the lens fixing frame 120, 124 or 126 and fixed to the lens fixing frame 120, 124 or 126 by the pressing metal jig 121, 125 or 128. This structure increases the cost and labor for manufacturing the optical system.

When an insulative plastic casing and an aspherical plastic lens are employed to reduce the manufacturing costs of the optical system, the plastic casing also expands or contracts in response to expansion or contraction of the transparent filler. The expansion and contraction of the casing further cause larger displacement of the focal point, that is hazardous for obtaining a clear image.

In view of the foregoing, it is an object of the invention to obviate the above described problems of the conventional semiconductor optical sensing apparatuses.

It is another object of the invention to provide an economical semiconductor optical sensing apparatus having a simple structure, that is less affected by temperature variations.

It is a further object of the invention to provide a semiconductor optical sensing apparatus that facilitates preventing deterioration and variation of the optical characteristics, elongating the life of the apparatus and improving the reliability.

SUMMARY OF THE INVENTION

According to an aspect of the invention, there is provided a semiconductor optical sensing apparatus including: a casing having one or more openings in its bottom portion and being made of an electrically insulative material; wiring means extending from the inside to the outside of the casing; a semiconductor optical sensor chip bonded to the bottom portion of the casing and having a terminal disposed on its surface; connecting means connecting the terminal and the wiring means; a transparent filler filling a space inside the casing, the one or more openings absorbing a volume change of the transparent filler caused by its expansion or contraction; a transparent plate disposed above the semiconductor optical sensor chip with the transparent filler interposed in-between, the transparent plate being adhered or welded to the casing; and focusing means adhered or welded to the transparent plate in a positional relationship such that the focusing means focuses an image or images onto the semiconductor optical sensor chip. The focusing means, the transparent plate and the casing are made of the same material or materials having almost the same thermal expansion coefficients.

According to another aspect of the invention, there is provided a semiconductor optical sensing apparatus including: a casing including one or more openings in its bottom portion and being made of an electrically insulative material; wiring means extending from the inside to the outside of the casing; a semiconductor optical sensor chip bonded to the bottom portion of the casing and having a terminal disposed on its surface; connecting means connecting the terminal and the wiring means; a transparent filler filling a space inside the casing, the one or more openings absorbing a volume change of the transparent filler caused by its expansion or contraction; and focusing means positioned above the semiconductor optical sensor chip with the transparent filler interposed in-between such that the focusing means focuses an image or images onto the semiconductor optical sensor chip. The focusing means is adhered or welded to the casing. The focusing means and the casing are made of the same material or materials having almost the same thermal expansion coefficients.

According to a further aspect of the invention, there is provided a semiconductor optical sensing apparatus including: a casing having one or more openings in its bottom portion and supporting rods protruding inwardly, the casing being made of an electrically insulative material; wiring means extending from the inside to the outside of the casing; a semiconductor optical sensor chip bonded to the bottom portion of the casing and having a terminal disposed on its surface; connecting means connecting the terminal and the wiring means; a transparent filler filling the space inside the casing; a transparent plate positioned above the semiconductor optical sensor chip with the transparent filler interposed in-between to form one or more openings between the casing and the transparent plate, the transparent plate being adhered or welded to the supporting rods of the casing; and focusing means adhered or welded to the transparent plate in a positional relationship such that the focusing means focuses an image or images onto the semiconductor optical sensor chip. The one or more openings in the bottom portion of the casing and the one or more openings between the casing and the transparent plate absorb the volume change of the transparent filler caused by its expansion or contraction. Also, the focusing means, the transparent plate and the casing are made of the same material or materials having almost the same thermal expansion coefficients.

According to a still further aspect of the invention, there is provided a semiconductor optical sensing apparatus including: a casing including one or more openings in its bottom portion and supporting rods protruding inwardly, the casing being made of an electrically insulative material; wiring means extending from the inside to the outside of the casing; a semiconductor optical sensor chip bonded to the bottom portion of the casing and having a terminal disposed on its surface; connecting means connecting the terminal and the wiring means; a transparent filler filling the space inside the casing; and focusing means positioned above the semiconductor optical sensor chip with the transparent filler interposed in-between to form one or more openings between the casing and the focusing means such that the focusing means focuses an image or images onto the semiconductor optical sensor chip. The focusing means is adhered or welded to the supporting rods of the casing. The one or more openings in the bottom portion of the casing and the one or more openings between the casing and the transparent plate absorb the volume change of the transparent filler caused by its expansion or contraction. The focusing means and the casing are made of the same material or materials having almost the same thermal expansion coefficients.

According to a still further aspect of the invention, there is provided a semiconductor optical sensing apparatus including: a casing having one or more openings in its bottom portion and being made of an electrically insulative material; wiring means extending from the inside to the outside of the casing; a semiconductor optical sensor chip bonded to the bottom portion of the casing and having a terminal disposed on its surface; connecting means for connecting the terminal and the wiring means; a transparent filler filling the space inside the casing, the one or more openings absorbing the volume change of the transparent filler caused by its expansion or contraction; an iris plate, disposed above the semiconductor optical sensor chip with the transparent filler interposed in-between and adhered or welded to the casing, for limiting light beams entering the semiconductor optical sensor chip; and focusing means adhered or welded to the iris plate in a positional relationship such that the focusing means focuses an image or images onto the semiconductor optical sensor chip. The focusing means, the iris plate and the casing are made of the same material or materials having almost the same thermal expansion coefficients.

Advantageously, the focusing means includes at least a pair of lenses, and the iris plate has apertures corresponding to the lenses.

Preferably, the semiconductor optical sensing apparatus further includes covering means for covering the one or more openings.

The semiconductor optical sensing apparatus may further include coating means for coating the transparent filler in the one or more openings.

Also, the semiconductor optical sensing apparatus may further include protecting means for protecting the transparent filler.

Preferably, the transparent filler is transparent silicone gel.

DETAILED DESCRIPTION OF PREFERRED EMBODIMENTS

Figure 1A:
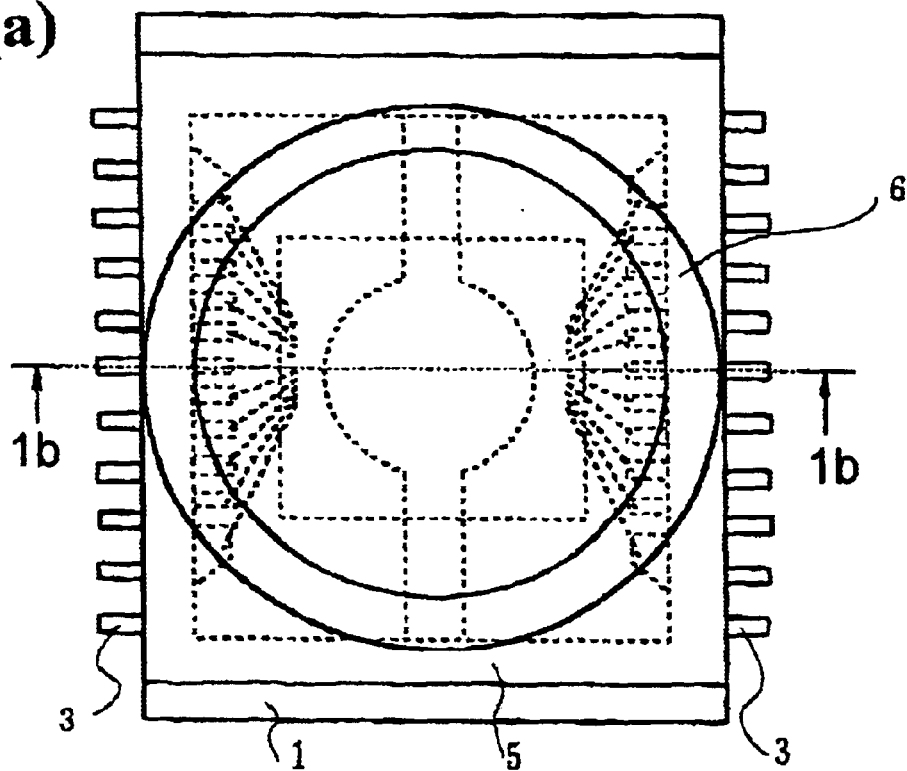
FIG. 1(a) is a plan view of a semiconductor optical sensing apparatus according to a first embodiment of the invention.
Figure 1B:
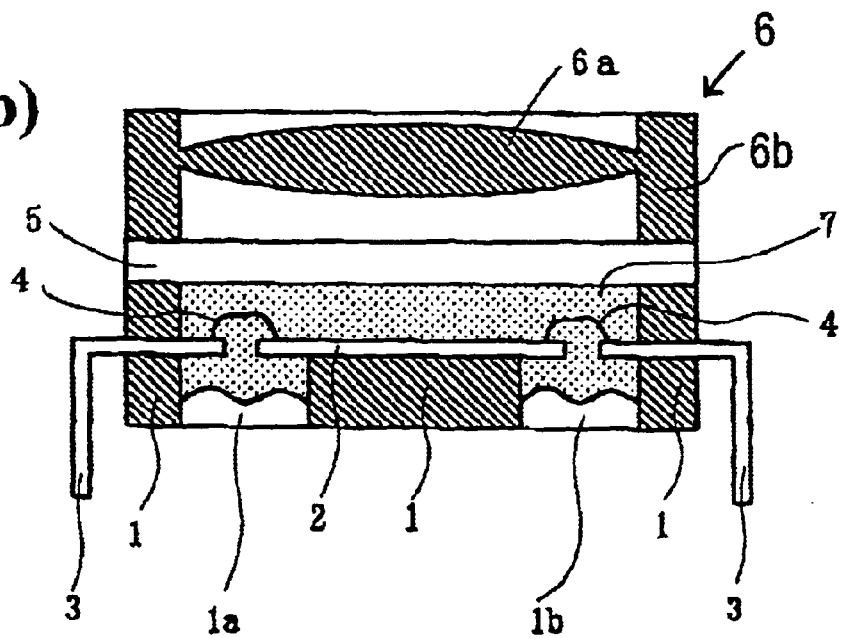
FIG. 1(b) is a cross sectional view taken along line 1b—1b of FIG. 1(a)
Figure 19A:
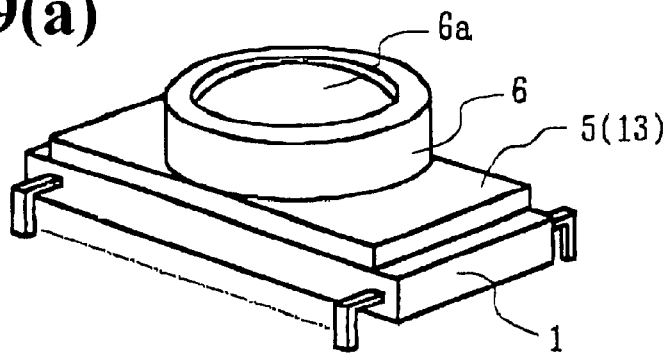
FIGS. 19(a) through 19(d) are perspective views for showing typical external appearances of the semiconductor optical sensing apparatuses.

Now, the present invention will be explained hereinafter with reference to the accompanying drawings which illustrate the preferred embodiments of the invention. FIG. 1(a) is a plan view of a semiconductor optical sensing apparatus according to a first embodiment of the invention. FIG. 1(b) is a cross sectional view taken along line 1b—1b of FIG. 1(a). The semiconductor optical sensing apparatus has an external appearance as shown in FIG. 19(a).

A semiconductor optical sensor chip 2 is bonded onto the bottom of a plastic casing 1. The sensor chip may be a CCD image sensor, an MOS image sensor, a photodiode, an ultraviolet ray sensor or such an optical sensor. The plastic casing 1 includes a bonding portion, on which the sensor chip 2 is bonded, a supporting portion for supporting the bonding portion, and openings 1a and 1b. The openings 1a and 1b are opened in the bottom of the plastic casing 1 except the bonding portion and the supporting portion.

Lead frames 3 as wiring means extend from the inside to the outside of the plastic casing 1. Internal terminals on the surface of the sensor chip 2 are connected to the lead frames 3 via bonding wires 4 as connecting means. A transparent plate 5 is adhered or welded to the upper circumference of the plastic casing 1. The transparent plate 5 is wide enough to completely cover the upper opening of the plastic casing 1.

Focusing means 6 is adhered or welded to the upper circumference of the transparent plate 5. The focusing means 6 includes a lens 6a and a frame 6b integrally formed therewith. The lens 6a is formed under an upper surface of the frame 6b. The lens 6a focuses an image or images onto the sensor chip 2. The plastic casing 1, the transparent plate 5 and the focusing means 6 are made of the same material. Or, the plastic casing 1, the transparent plate 5 and the focusing means 6 are made of materials, thermal expansion coefficients of which are almost the same. The reason for this will be described later.

The space inside the plastic casing 1 is filled with transparent silicone gel 7 as a transparent filler. The transparent silicone gel 7 is exposed outside through the openings 1a and 1b at the bottom of the plastic casing 1. According to the first embodiment, the transparent silicone gel 7 completely fills the space inside the plastic casing 1 in such a manner that the transparent silicone gel 7 completely seals and protects the sensor chip 2 and the bonding wires 4. Gas which adversely affects the semiconductor sensor chip is not used for sealing according to the first embodiment. Therefore, the characteristics of the semiconductor optical sensing apparatus are maintained stably according to the first embodiment.

According to the first embodiment, the openings 1a and 1b are opened at the bottom of the plastic casing 1 and the transparent silicone gel 7 is exposed outside through the openings 1a and 1b. Due to this, the levels of the transparent silicone gel 7 in the openings 1a and 1b lower or rise in response to the expansion or contraction of the transparent silicone gel 7 caused by temperature change. In the other words, the openings 1a and 1b absorb the volume change of the transparent silicone gel 7 caused by temperature change. In contrast to the conventional closed structure wherein the inner space of the casing is filled with the transparent filler completely, the open structure according to the first embodiment prevents bubbles in the filler, suction of air, parting between the filler and casing and defects due to expansion and contraction of the filler, and facilitates maintaining the characteristics of the optical sensing apparatus stably.

Moreover, since the transparent plate 5 is bonded tightly to the upper face of the plastic casing 1, the distance between the surface of the transparent plate 5 and the surface of the sensor chip 2 never changes even when the transparent silicone gel 7 in the casing expands or contracts. Therefore, the volume change of the transparent silicone gel 7 does not adversely affect the optical properties.

The plastic casing 1, the transparent plate 5 and the focusing means 6 may be manufactured economically since these constituent elements are made of the same material or the materials having almost the same thermal expansion coefficients. When the temperature rises, for example, the plastic casing 1, the transparent plate 5 and the focusing means 6 expand in unison such that the shapes before and after the expansion are similar. The radius and thickness of the lens 6a elongate and the lens 6a expands upwards keeping the focal length at a constant value since the curvature of the lens 6a is kept at a constant value. At the same time, the plastic casing 1 expands upwards and the semiconductor optical sensor chip 2 on the plastic casing 1 moves upwards. As a result, the distance between the lens 6a and the sensor chip 2 is always maintained at the focal length of the lens 6a and the optical properties of the semiconductor optical sensing apparatus are maintained stably.

Now the method of manufacturing the semiconductor optical sensing apparatus according to the first embodiment will be described. Metal plates (lead frames 3) are inserted into a molding die and a plastic casing 1 is formed by injection molding of a thermoplastic resin using the molding die. A semiconductor optical sensor chip 2 is bonded onto the plastic casing 1. The bonding wires 4 are bonded to the sensor chip 2 and the lead frames 3. A transparent plate 5 is bonded with an adhesive or by ultrasonic wave to the plastic casing 1.

The focusing means 6 is adhered or welded to the transparent plate 5. The bonding steps are conducted easily since the plastic casing 1, the transparent plate 5 and the focusing means 6 are made of the same material or the materials having almost the same thermal expansion coefficients. Then, the plastic casing 1 with the other constituent elements 2, 5 and 6 assembled so far is turned upside down and transparent silicone gel 7 is injected through the openings 1a and 1b. The plastic casing 1 is placed in an oven and the transparent silicone gel 7 is cured thermally.

The focal point of the lens 6a is positioned always on the semiconductor optical sensor chip 2 even when the plastic casing 1, the transparent plate 5 and the focusing means 6 expand or contract thermally. The openings 1a and 1b absorb the volume change of the transparent silicone gel 7 due to the thermal expansion or contraction such that stable sealing is maintained. Thus, the semiconductor optical sensing apparatus according to the first embodiment exhibits high detection capability even in the environments in which the temperature changes sharply or widely.

Figure 19B:
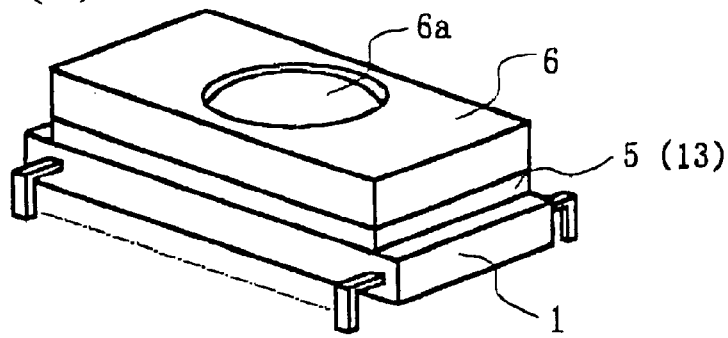

Exemplarily, the focusing means 6 has a cylindrical shape as shown in FIGS. 1(a), 1(b) and 19(a). The focusing means 6 may be shaped with a parallelepiped plate, i.e. rectangular shape, to which the lens 6a is incorporated, as shown in FIG. 19(b). The semiconductor optical sensing apparatuses according to the following embodiments may have a cylindrical shape, or a parallelepiped, i.e. rectangular, shape.

Figure 2A:
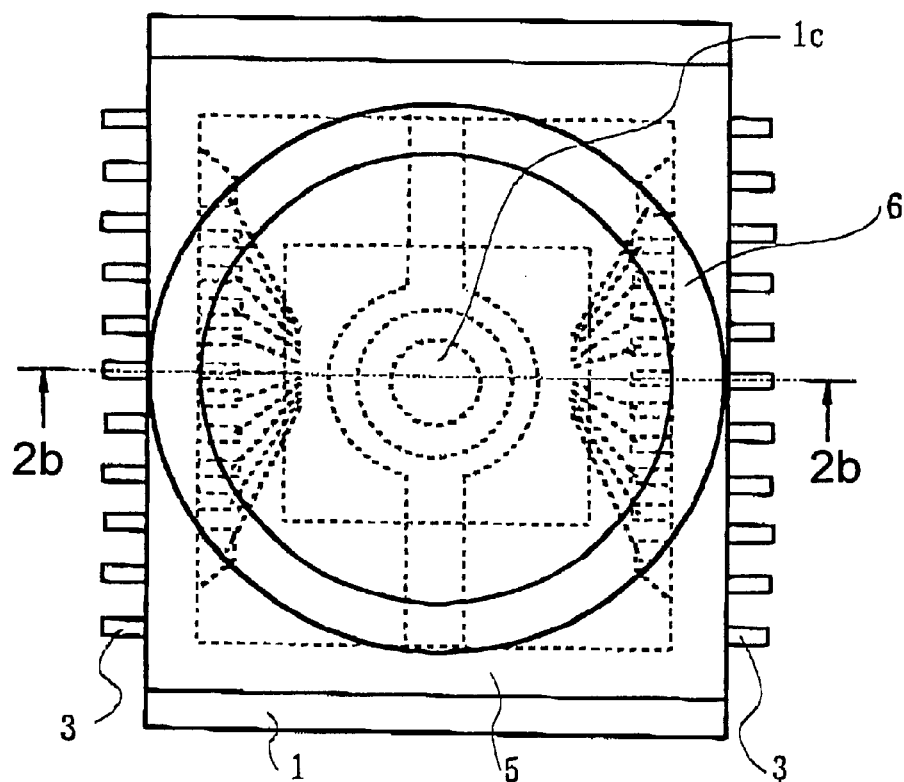
FIG. 2(a) is a plan view of a semiconductor optical sensing apparatus according to a second embodiment of the invention.
Figure 2B:
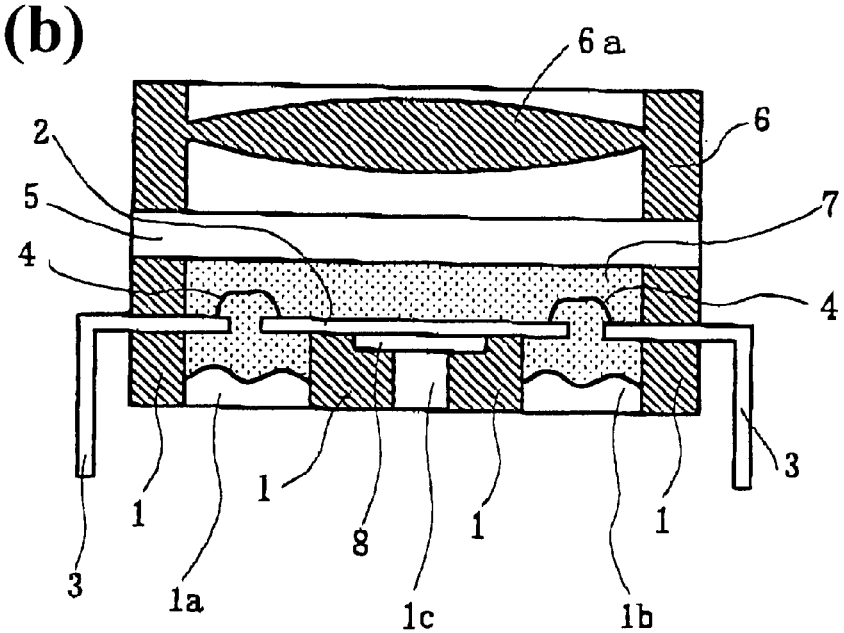
FIG. 2(b) is a cross sectional view taken along line 2b—2b of FIG. 2(a)

FIG. 2(a) is a plan view of a semiconductor optical sensing apparatus according to a second embodiment of the invention. FIG. 2(b) is a cross sectional view taken along line 2b—2b of FIG. 2(a). The semiconductor optical sensing apparatus according to the second embodiment has an external appearance as shown in FIG. 19(a).

The semiconductor optical sensing apparatus according to the second embodiment is different from the semiconductor optical sensing apparatus according to the first embodiment in that the sensing apparatus according to the second embodiment includes a metal die pad 8 disposed in the bonding position of a plastic casing 1, to which a sensor chip 2 is bonded. The metal die pad 8 is inserted to connect the package potential of the sensor chip 2 to the ground and to improve the adhesiveness of the plastic casing 1 and the sensor chip 2.

An opening 1c is opened through a portion of the plastic casing, on which the metal die pad 8 is disposed. A pin for holding the die pad 8 is inserted to the opening 1c so that the die pad 8 may not be moved by the resin injection during the injection molding of the plastic casing 1. Since the other constituent elements and their configurations are the same as those of the first embodiment, the semiconductor optical sensing apparatus according to the second embodiment exhibits the same effects as those of the semiconductor optical sensing apparatus according to the first embodiment. When the focusing means 6 is shaped with a parallelepiped form, the semiconductor optical sensing apparatus has an external appearance as shown in FIG. 19(b).

Figure 3A:
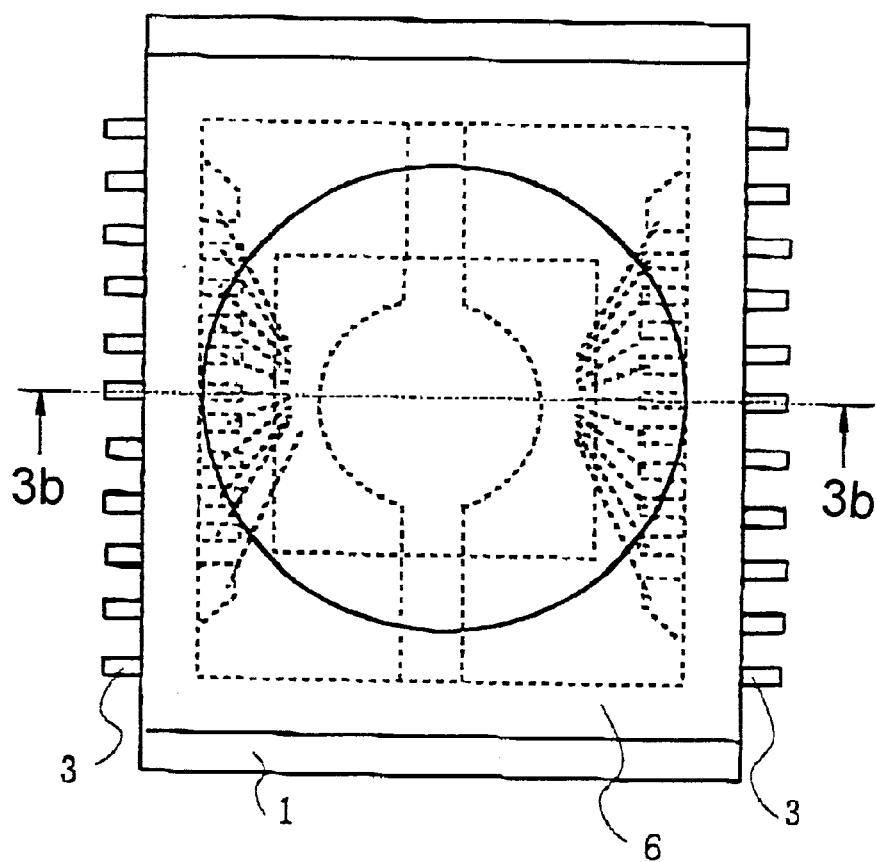
FIG. 3(a) is a plan view of a semiconductor optical sensing apparatus according to a third embodiment of the invention.
Figure 3B:
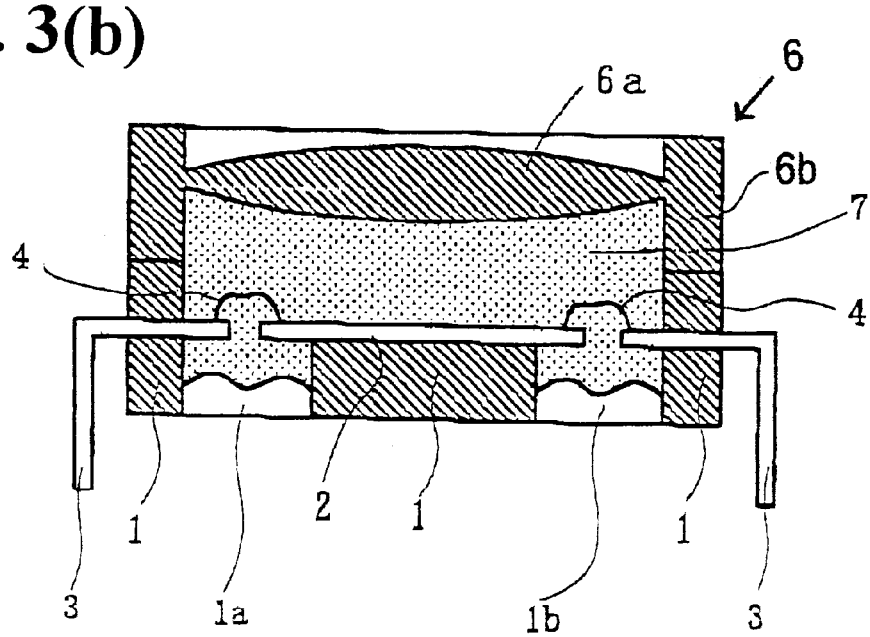
FIG. 3(b) is a cross sectional view taken along line 3b—3b of FIG. 3(a)
Figure 19C:
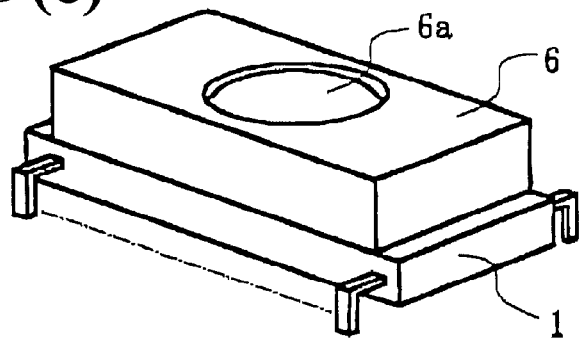

FIG. 3(a) is a plan view of a semiconductor optical sensing apparatus according to a third embodiment of the invention. FIG. 3(b) is a cross sectional view taken along line 3b—3b of FIG. 3(a). The semiconductor optical sensing apparatus according to the third embodiment has an external appearance as shown in FIG. 19(c).

The semiconductor optical sensing apparatus according to the third embodiment has a structure excluding the transparent plate 5 from the semiconductor optical sensing apparatus according to the first embodiment, and focusing means 6 is directly adhered or welded to the plastic casing 1. As shown in FIG. 19(c), the focusing means 6 is shaped with a parallelepiped or rectangular form, that is wide enough to completely cover the upper opening of a plastic casing 1. A lens 6a is configured such that its focal point is positioned always on a semiconductor optical sensor chip 2.

The plastic casing 1 and the focusing means 6 are made of the same material or materials having almost the same thermal expansion coefficients.

The focal point of the lens 6a is positioned always on the semiconductor optical sensor chip 2 even when the plastic casing 1 and the focusing means 6 expand or contract thermally. Openings 1a and 1b absorb the volume change of the transparent silicone gel 7 due to the thermal expansion or contraction such that stable sealing is maintained. Thus, the semiconductor optical sensing apparatus according to the third embodiment exhibits high detection capability even in the environments in which the temperature changes sharply or widely.

Figure 4A:
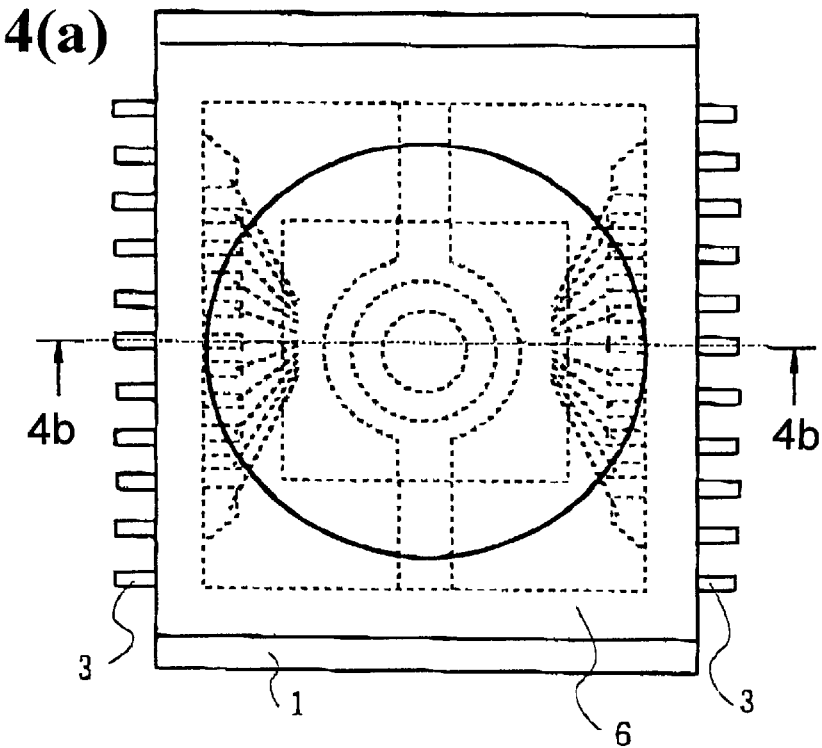
FIG. 4(a) is a plan view of a semiconductor optical sensing apparatus according to a fourth embodiment of the invention.
Figure 4B:
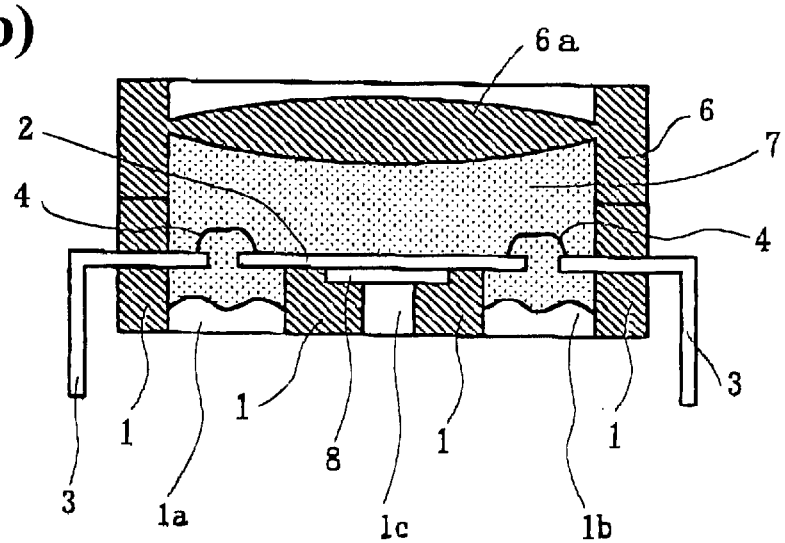
FIG. 4(b) is a cross sectional view taken along line 4b—4b of FIG. 4(a)

FIG. 4(a) is a plan view of a semiconductor optical sensing apparatus according to a fourth embodiment of the invention. FIG. 4(b) is a cross sectional view taken along line 4b—4b of FIG. 4(a). The semiconductor optical sensing apparatus according to the fourth embodiment has an external appearance as shown in FIG. 19(c).

The semiconductor optical sensing apparatus according to the fourth embodiment has a structure, that includes a metal die pad 8 to the sensing apparatus according to the third embodiment. The metal die pad 8 is disposed in the bonding position of a plastic casing 1, where a semiconductor optical sensor chip 2 is bonded. The plastic casing 1 and focusing means 6 are made of the same material or materials having almost the same thermal expansion coefficients. The semiconductor optical sensing apparatus according to the fourth embodiment exhibits the same effects as those of the semiconductor optical sensing apparatus according to the third embodiment.

Figure 5A:
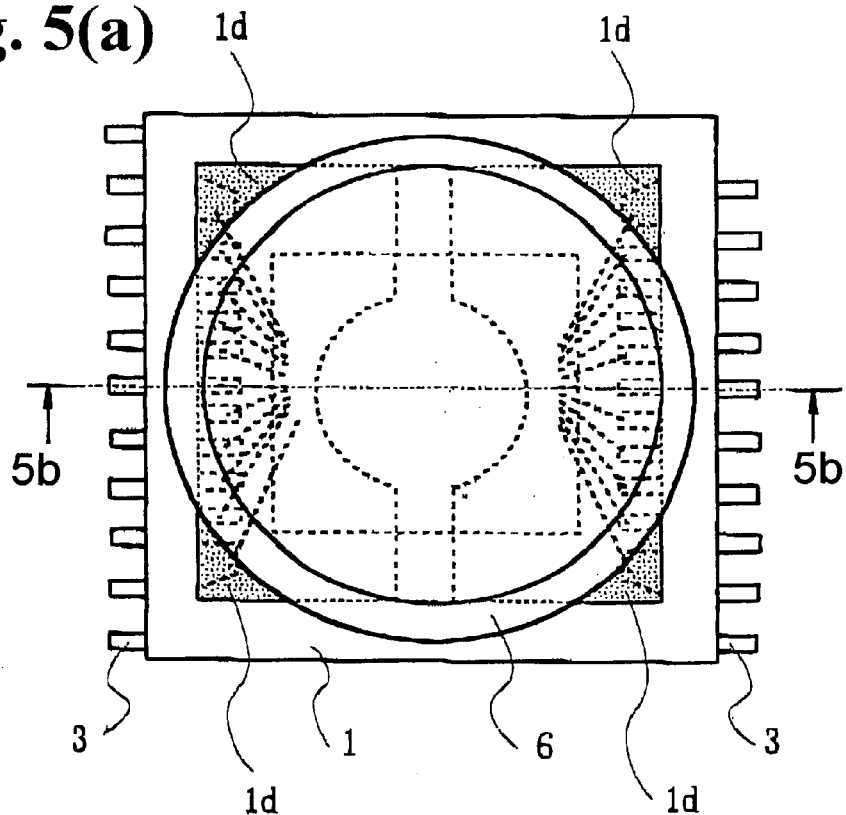
FIG. 5(a) is a plan view of a semiconductor optical sensing apparatus according to a fifth embodiment of the invention.
Figure 5B:
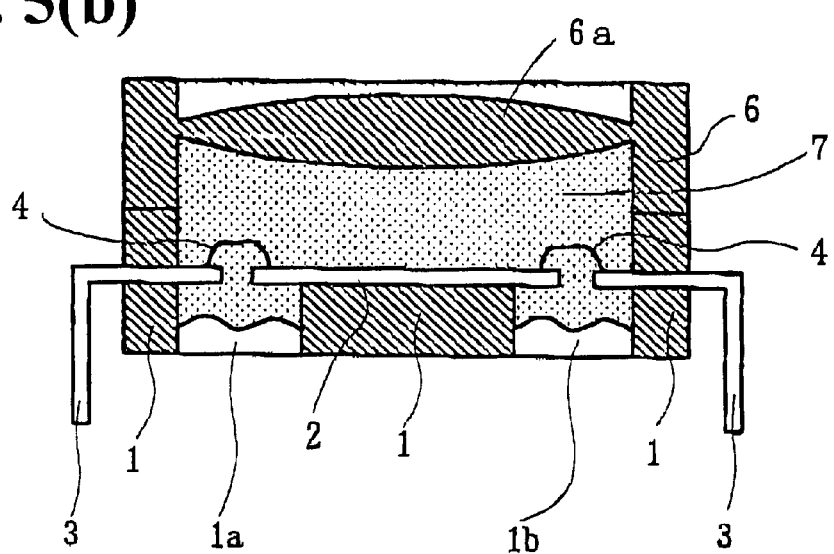
FIG. 5(b) is a cross sectional view taken along line 5b—5b of FIG. 5(a)
Figure 19D:
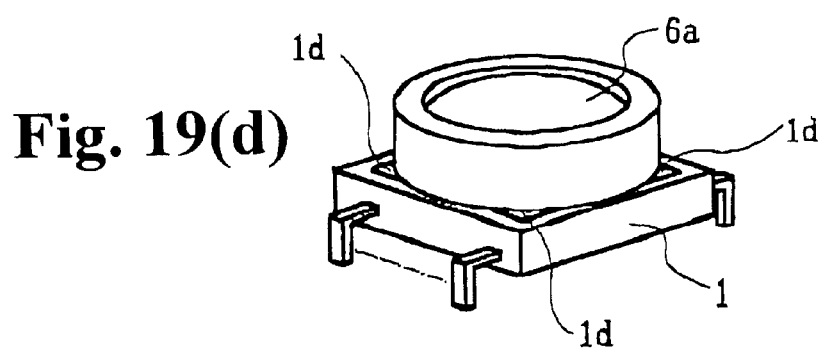
Figure 20A:
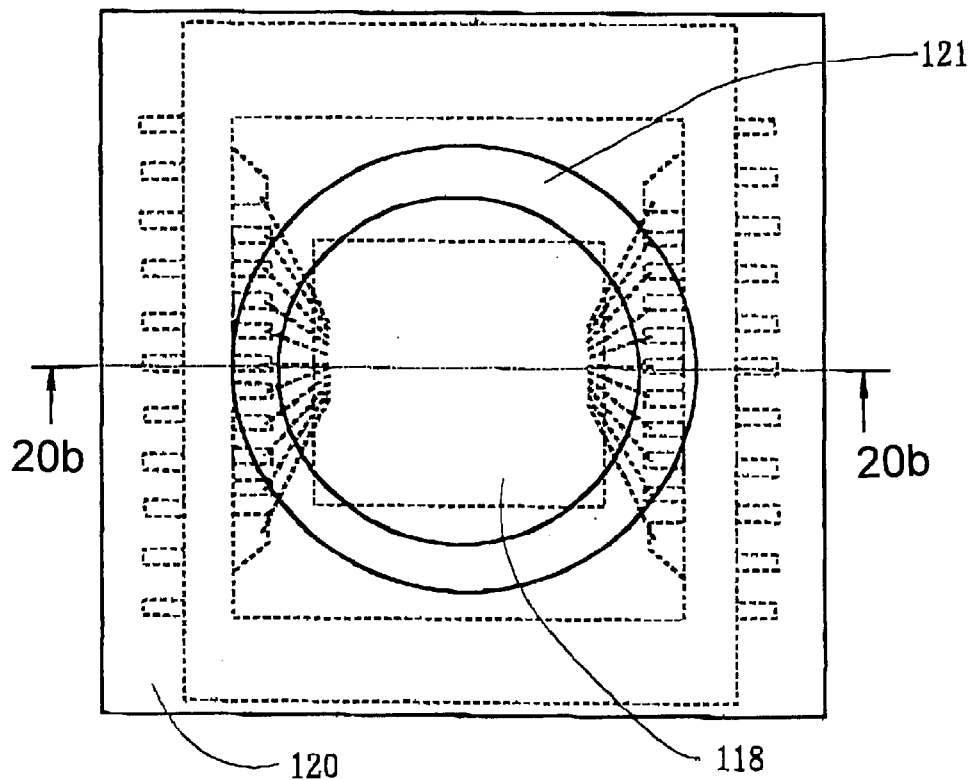
FIG. 20(a) is a plan view of a conventional semiconductor optical sensing apparatus.
Figure 20B:
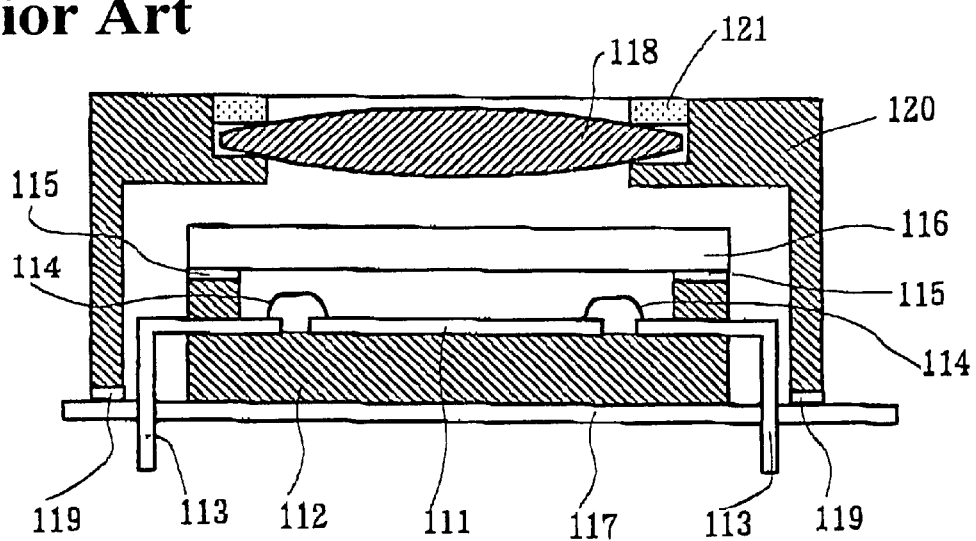
FIG. 20(b) is a cross sectional view taken along line 20b—20b of FIG. 20(a)
Figure 21A:
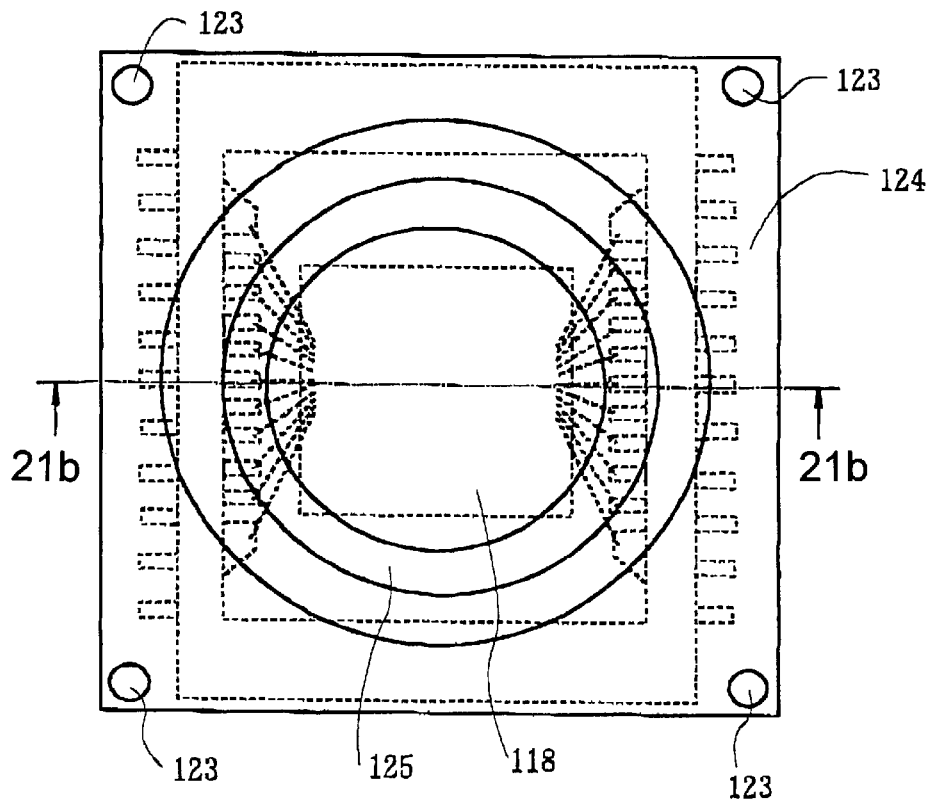
FIG. 21(a) is a plan view of another conventional semiconductor optical sensing apparatus.
Figure 21B:
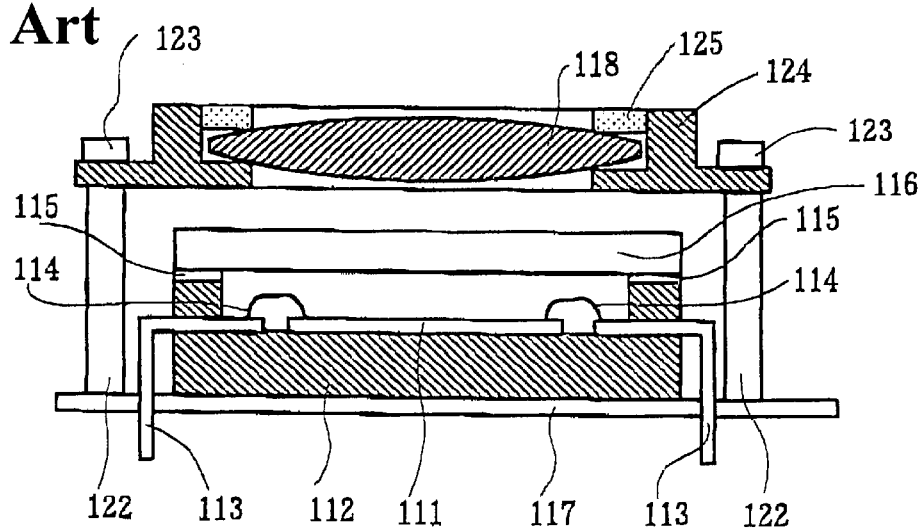
FIG. 21(b) is a cross sectional view taken along line 21b—21b of FIG. 21(a)
Figure 22A:
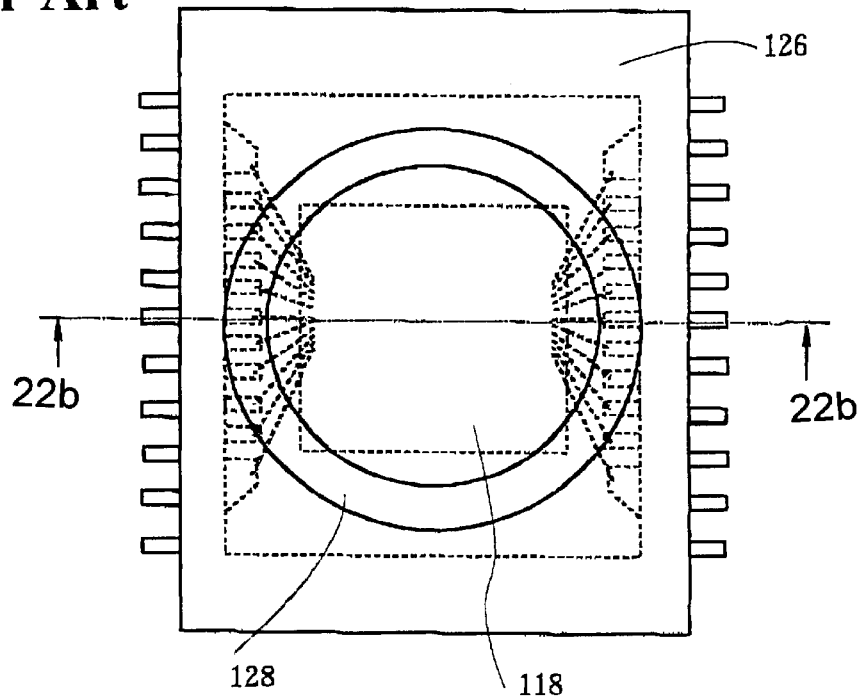
FIG. 22(a) is a plan view of still further conventional semiconductor optical sensing apparatus.
Figure 22B:
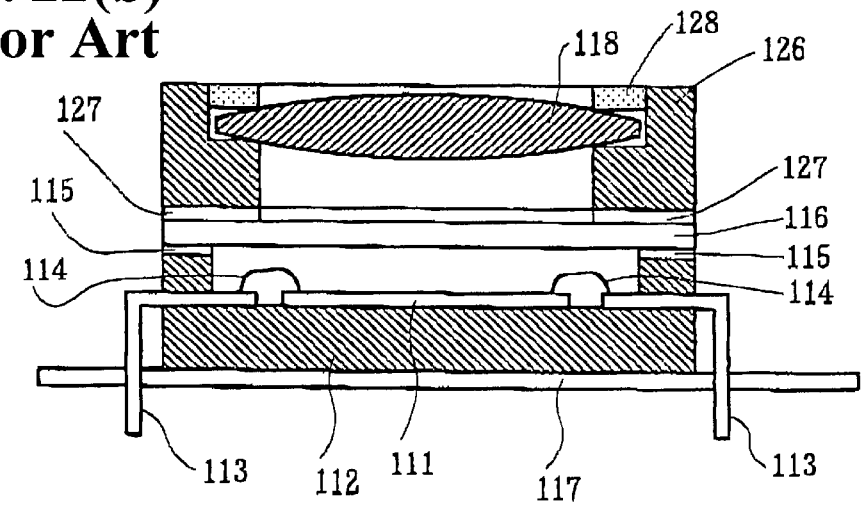
FIG. 22(b) is a cross sectional view taken along line 22b—22b of FIG. 22(a).

FIG. 5(a) is a plan view of a semiconductor optical sensing apparatus according to a fifth embodiment of the invention. FIG. 5(b) is a cross sectional view taken along line 5b—5b of FIG. 5(a). The semiconductor optical sensing apparatus according to the fifth embodiment has an external appearance as shown in FIG. 19(d).

The semiconductor optical sensing apparatus according to the fifth embodiment has essentially the same structure as that of the sensing apparatus according to the third embodiment. A cylindrical focusing means 6 is used in substitution for the focusing means of to the third embodiment, which is shaped with a parallelepiped form. The focusing means 6 is adhered or welded directly to a casing 1. As shown in FIGS. 5(a) and 5(b), transparent silicone gel 7 is exposed to the outside through openings 1a, 1b and 1d. The openings 1d are formed in the upper portion of the casing 1.

A lens 6a is incorporated in the focusing means 6 and arranged above a semiconductor optical sensor chip 2 in a positional relationship such that the lens 6a focuses an image or images onto the semiconductor optical sensor chip 2. The plastic casing 1 and the focusing means 6 are made of the same material or materials having almost the same thermal expansion coefficients.

The focal point of the lens 6a is positioned always on the sensor chip 2 even when the transparent silicone gel expands or contracts. The openings 1a, 1b and 1d absorb the volume change of the transparent silicone gel 7 due to the thermal expansion or contraction so that stable sealing may be maintained. Thus, the semiconductor optical sensing apparatus according to the fifth embodiment exhibits high detection capability even in the environments in which the temperature changes sharply or widely. In this embodiment, a metal die pad 8 may be disposed in the bonding portion of the casing 1.

Figure 6A:
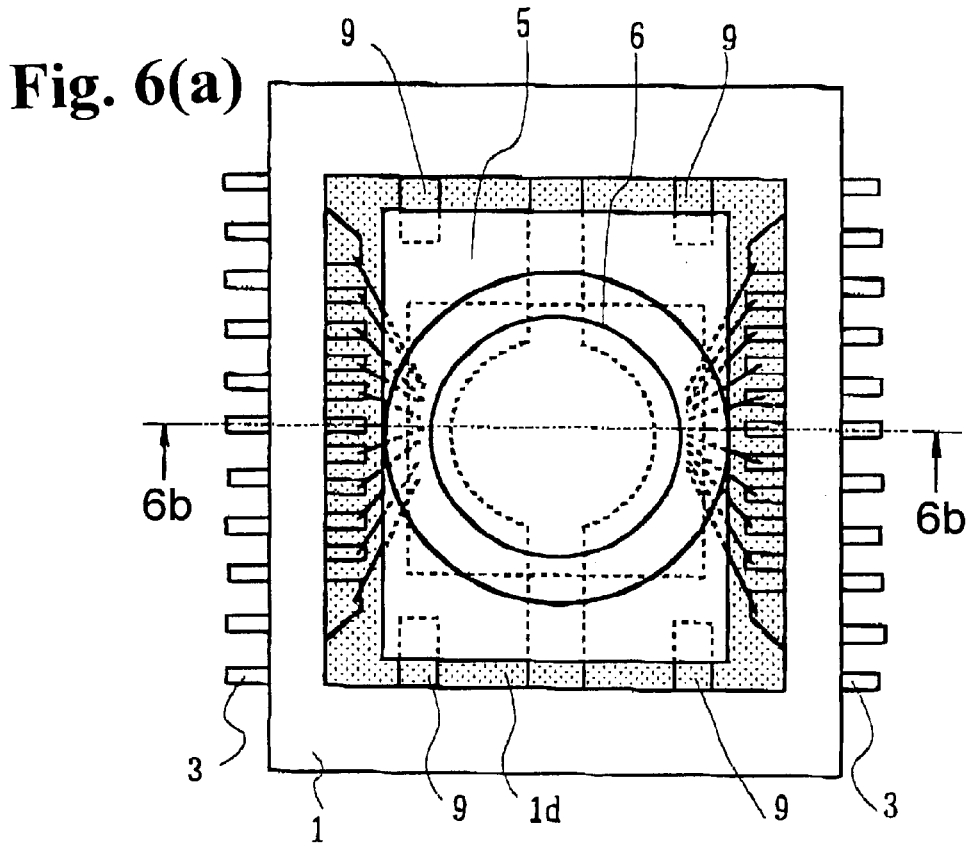
FIG. 6(a) is a plan view of a semiconductor optical sensing apparatus according to a sixth embodiment of the invention.
Figure 6B:
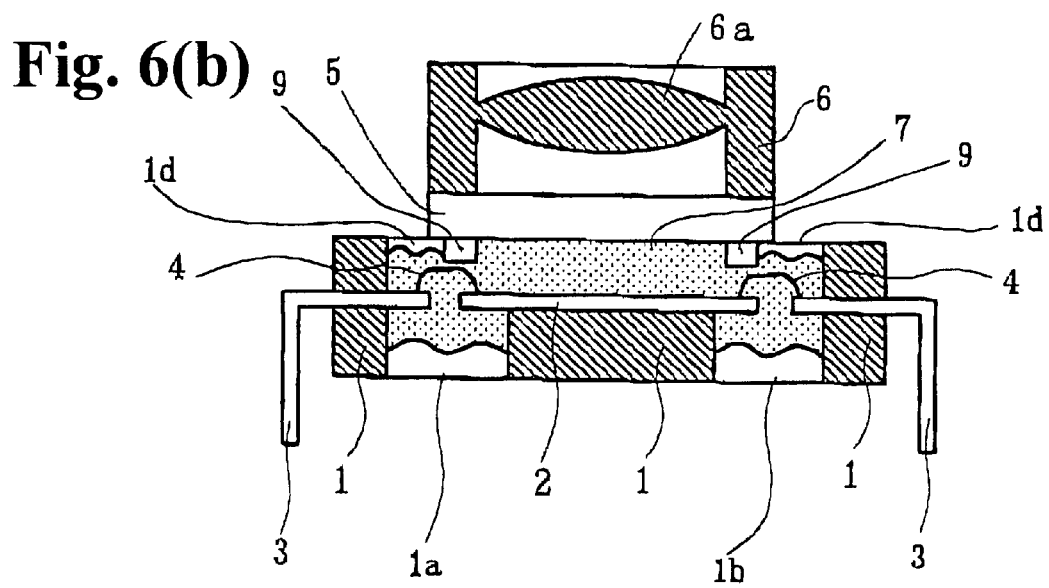
FIG. 6(b) is a cross sectional view taken along line 6b—6b of FIG. 6(a)

FIG. 6(a) is a plan view of a semiconductor optical sensing apparatus according to a sixth embodiment of the invention. FIG. 6(b) is a cross sectional view taken along line 6b—6b of FIG. 6(a).

The semiconductor optical sensing apparatus includes a plastic casing 1, a transparent plate 5 and focusing means 6. The plastic casing 1 includes a bonding portion, on which a sensor chip 2 is bonded, a supporting portion for supporting the bonding portion, openings 1a and 1b, and supporting rods 9. The openings 1a and 1b are opened in the bottom of the plastic casing 1 except the supporting portion. An opening 1d is formed between the transparent plate 5 and the plastic casing 1. The supporting rods 9 extend inwardly from the inner side walls of the plastic casing 1, which face each other.

Lead frames 3 extend from the inside to the outside of the plastic casing 1. The semiconductor optical sensor chip 2 is bonded to the bottom (bonding portion) of the plastic casing 1. Internal terminals on the surface of the sensor chip 2 are connected to the lead frames 3 via bonding wires 4. The space inside the plastic casing 1 is filled with transparent silicone gel 7. The transparent plate 5 is disposed on the transparent silicone gel 7 and supported by the supporting rods 9 such that the opening 1d is formed, as shown by the area in FIG. 6(a), around the transparent plate 5. The transparent silicone gel 7 is exposed outside through the openings 1a, 1b and 1d.

The transparent plate 5 does not directly contact the plastic casing 1. The bottom of the transparent plate 5 contacts directly the surface of the transparent silicone gel 7. The focusing means 6 is adhered or welded to the upper circumference of the transparent plate 5. The focusing means 6 includes a lens 6a integrally formed therein such that the lens 6a focuses an image or images onto the sensor chip 2.

According to the sixth embodiment, the space inside the plastic casing 1 is completely filled with the transparent silicone gel 7. The transparent silicone gel 7 completely seals and protects the sensor chip 2 and the bonding wires 4. Gas adversely affecting the semiconductor sensor chip is not used for sealing according to the sixth embodiment.

Therefore, the characteristics of the semiconductor sensor chip are maintained stably according to the sixth embodiment.

According to the sixth embodiment, the openings 1a and 1b are opened in the bottom of the plastic casing 1 and the opening 1d is formed in the upper surface of the plastic casing 1. The transparent silicone gel 7 is exposed outside through the openings 1a, 1b and 1d. Due to this open structure, the levels of the transparent silicone gel 7 in the openings 1a, 1b and 1d move in response to the expansion or contraction of the transparent silicone gel 7 caused by temperature change. In other words, the openings 1a, 1b and 1d absorb the volume change of the transparent silicone gel 7 caused by temperature change.

The open structure according to the sixth embodiment prevents bubbles in the filler, suction of air, parting between the filler and casing and other defects due to expansion and contraction of the filler, and facilitates to maintain the characteristics of the optical sensing apparatus stably.

Even when the transparent silicone gel 7 expands or contracts, the distance between the transparent plate 5 and the sensor chip 2 is not changed since the transparent plate 5 is supported by the supporting rods 9.

The plastic casing 1, the transparent plate 5 and the focusing means 6 may be manufactured economically since these constituent elements are made of the same material or the materials having almost the same thermal expansion coefficients. When the plastic casing 1, the transparent plate 5 and the focusing means 6 expand due to temperature rise, the lens 6a also expands and, therefore, its focal length elongates such that the focal point is always on the sensor chip 2. Thus, stable characteristics are maintained. Therefore, volume change of the transparent silicone gel does not adversely affect the optical characteristics of the semiconductor optical sensing apparatus.

If necessary, a metal die pad may be arranged in the bonding position of the sensor chip 2 at the bottom of the plastic casing 1.

In place of supporting the transparent plate 5 by the supporting rods 9, the transparent plate 5 may be extended in the horizontal or vertical direction of FIG. 6(a) and adhered or welded directly to the plastic casing 1 except the openings 1d.

The focusing means 6 may be formed to have a cylindrical shape or a parallelepiped shape.

Figure 7A:
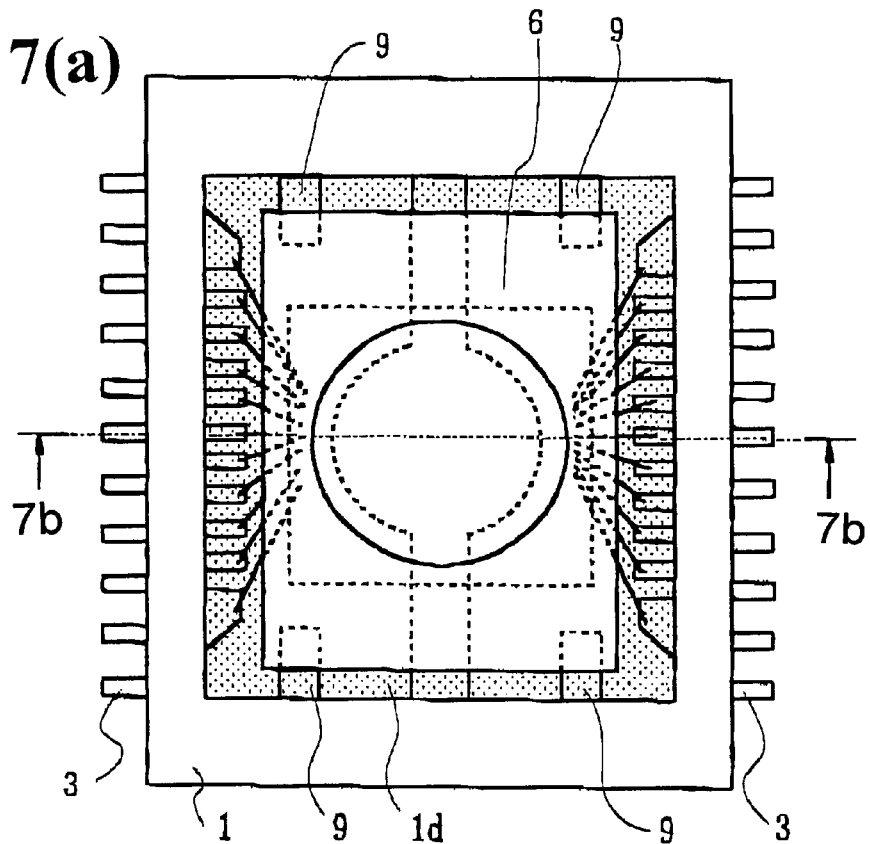
FIG. 7(a) is a plan view of a semiconductor optical sensing apparatus according to a seventh embodiment of the invention.
Figure 7B:
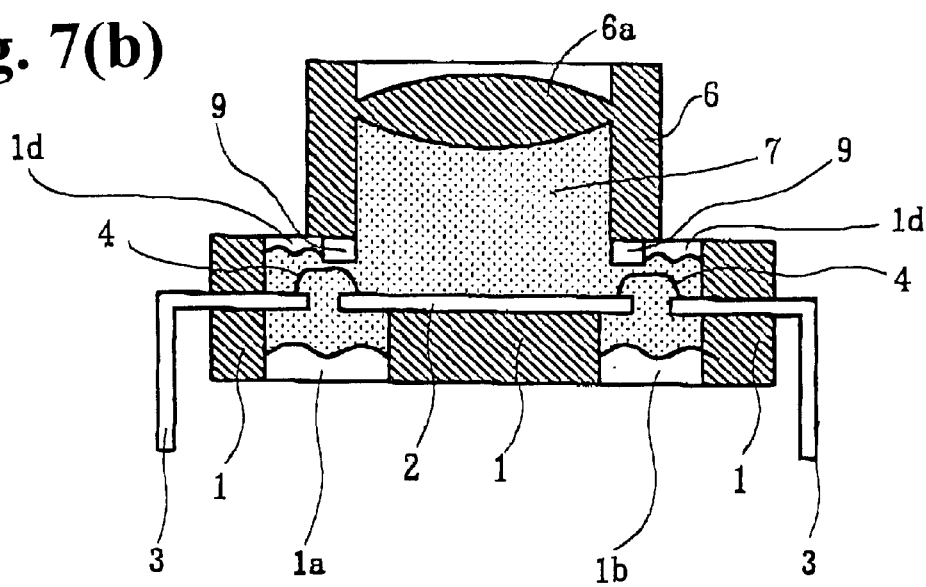
FIG. 7(b) is a cross sectional view taken along line 7b—7b of FIG. 7(a)

FIG. 7(a) is a plan view of a semiconductor optical sensing apparatus according to a seventh embodiment of the invention. FIG. 7(b) is a cross sectional view taken along 7b—7b of FIG. 7(a). Focusing means 6 shaped with a parallelepiped rectangular form, is placed on transparent silicone gel 7 and supported by supporting rods 9 such that an opening 1d is formed around the focusing means, as shown by an area in FIG. 7(a). The transparent silicone gel 7 is exposed outside through the openings 1a, 1b and 1d.

The semiconductor optical sensing apparatus according to the seventh embodiment has a structure excluding the transparent plate 5 from the semiconductor optical sensing apparatus according to the sixth embodiment, and the focusing means 6 is adhered or welded directly to the supporting rods 9. The focusing means 6 is shaped with a parallelepiped form and adhered or welded to the supporting rods 9 in such a positional relationship that a lens 6a focuses an image or images onto the semiconductor optical sensor chip 2.

The plastic casing 1 and the focusing means 6 are made of the same material or materials having almost the same thermal expansion coefficients. The semiconductor optical sensing apparatus according to the seventh embodiment exhibits the same effects as those of the semiconductor optical sensing apparatus according to the sixth embodiment.

If necessary, a metal die pad 8 may be arranged in the bonding position of the sensor chip 2 at the bottom of the plastic casing 1.

In place of supporting the transparent plate 5 by the supporting rods 9, the focusing means 6 may be extended in the horizontal or vertical direction of FIG. 7(a) and adhered or welded directly to the plastic casing 1 except openings 1d.

Figure 8A:
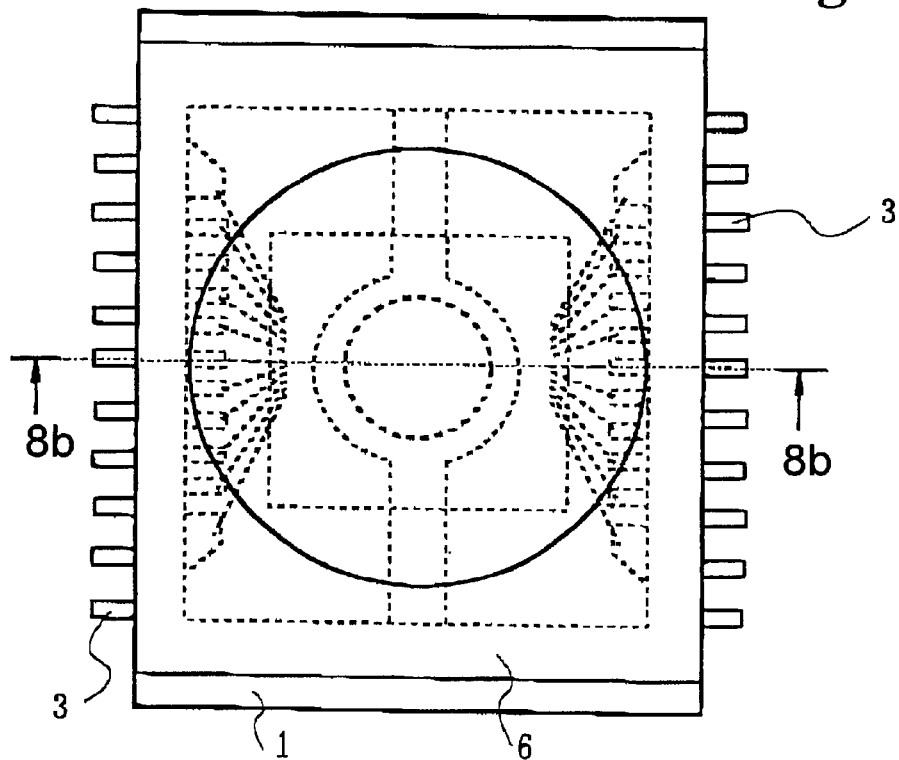
FIG. 8(a) is a plan view of a semiconductor optical sensing apparatus according to an eighth embodiment of the invention.
Figure 8B:
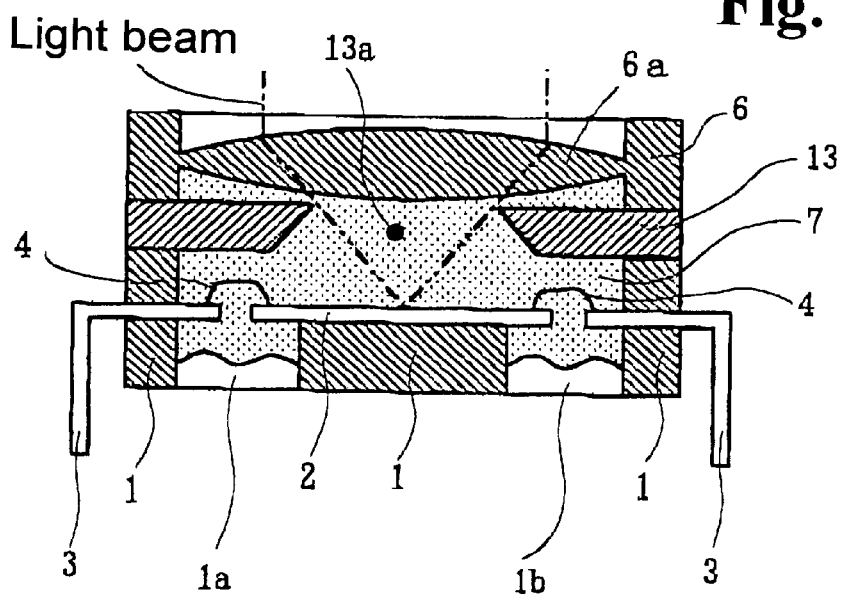
FIG. 8(b) is a cross sectional view taken along line 8b—8b of FIG. 8(a)

FIG. 8(a) is a plan view of a semiconductor optical sensing apparatus according to an eighth embodiment of the invention. FIG. 8(b) is a cross sectional view taken along line 8b—8b of FIG. 8(a). The semiconductor optical sensing apparatus according to the eighth embodiment has an external appearance as shown in FIG. 19(b).

The semiconductor optical sensing apparatus according to the eighth embodiment has a structure essentially the same as that of the sensing apparatus according to the first embodiment. The transparent plate 5 between the plastic casing 1 and the focusing means 6 of the sensing apparatus according to the first embodiment is replaced by an iris plate 13 having an aperture 13a. The iris plate 13 has a parallelepiped plate shape, that is wide enough to completely cover an upper opening of a plastic casing 1. The iris plate 13 is adhered or welded to the upper circumference of the plastic casing 1. Focusing means 6 is adhered or welded to the upper circumference of the iris plate 13.

A lens 6a is configured such that its focal point is positioned always on a semiconductor optical sensor chip 2. The plastic casing 1 and the focusing means 6 are made of the same material or materials having almost the same thermal expansion coefficients.

The focal point of the lens 6a is positioned always on the semiconductor optical sensor chip 2 even when the plastic casing 1 and the focusing means 6 expand or contract thermally openings 1a and 1b absorb the volume change of transparent silicone gel 7 due to the thermal expansion or contraction so that stable sealing may be maintained. Thus, the semiconductor optical sensing apparatus according to the eighth embodiment exhibits high detection capability even in the environments in which the temperature changes sharply or widely.

Although not described in the figures, the focusing means 6 with a box shape may be arranged in such a positional relationship that the box shaped focusing means 6 covers the iris plate 13 adhered or welded to the plastic casing 1, and is adhered or welded to the upper circumference of the plastic casing 1. In this case, the semiconductor optical sensing apparatus has an external appearance as shown in FIG. 19(c).

The focusing means 6 may be shaped with a cylindrical form. In this case, the semiconductor optical sensing apparatus has an external appearance as shown in FIG. 19(a).

Figure 9A:
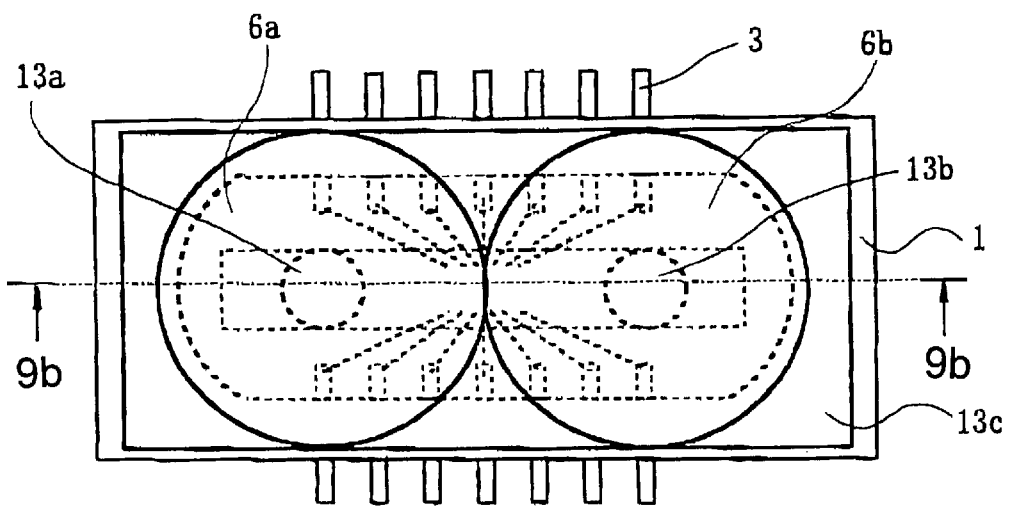
FIG. 9(a) is a plan view of a semiconductor optical sensing apparatus according to a ninth embodiment of the invention.
Figure 9B:
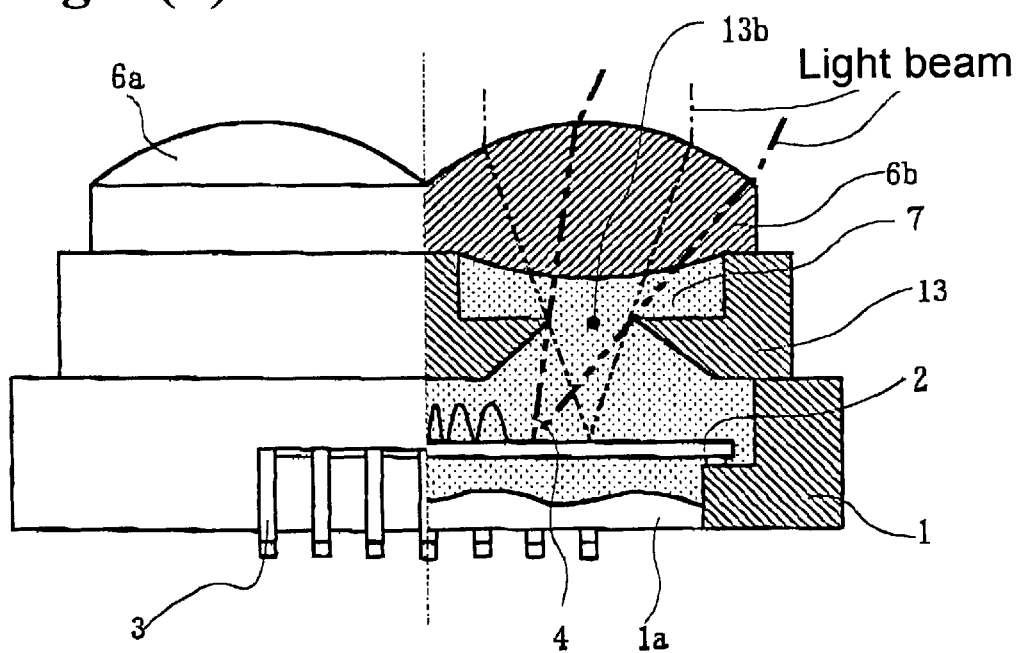
FIG. 9(b) is a partial cross sectional view taken along line 9b—9b of FIG. 9(a)

FIG. 9(a) is a plan view of a semiconductor optical sensing apparatus according to a ninth embodiment of the invention. FIG. 9(b) is a partial cross sectional view taken along line 9b—9b of FIG. 9(a).

Although the semiconductor optical sensing apparatus according to the ninth embodiment has a configuration essentially the same as that of the sensing apparatus according to the seventh embodiment, focusing means 6 has a lens set formed of multiple lenses. In FIGS. 9(a) and 9(b), the lens set is formed of a pair of lenses 6a and 6b.

An iris plate 13c for the lens set having apertures 13a and 13b is adhered or welded to the upper circumference of a plastic casing 1 having an opening 1a in its bottom portion. The lens set is adhered or welded to the upper surface of the iris plate 13 in a positional relationship such that the lenses 6a and 6b are located above the apertures 13a and 13b.

The lens set is configured such that it focuses images on two locations of a semiconductor optical sensor chip 2. The plastic casing 1 and the focusing means 6 are made of the same material or materials having almost the same thermal expansion coefficients.

The focal points of the lenses 6a and 6b are positioned always on the semiconductor optical sensor chip 2 even when the plastic casing 1 and the focusing means 6 expand or contract thermally. The opening 1a absorbs the volume change of transparent silicone gel 7 due to the thermal expansion or contraction so that stable sealing may be maintained. Thus, the semiconductor optical sensing apparatus according to the ninth embodiment exhibits high detection capability even in the environments in which the temperature changes sharply or widely.

Figure 10A:
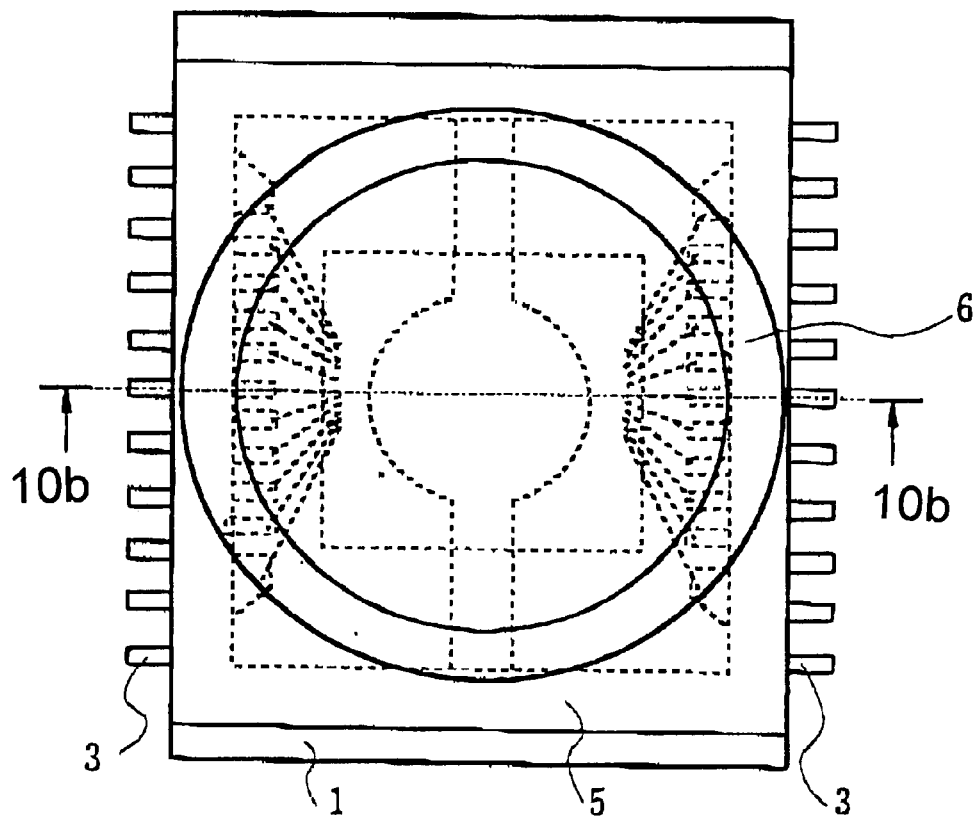
FIG. 10(a) is a plan view of a semiconductor optical sensing apparatus according to a tenth embodiment of the invention.
Figure 10B:
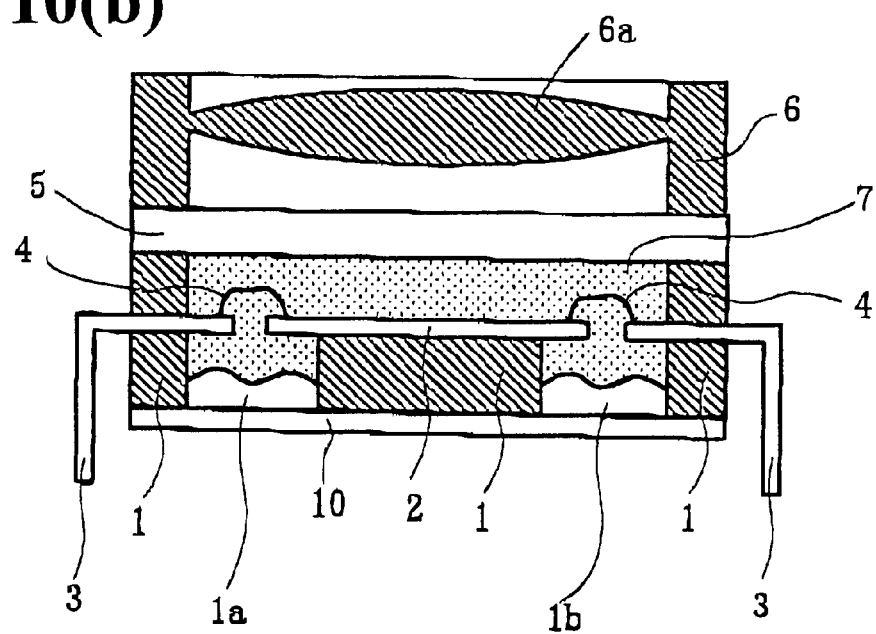
FIG. 10(b) is a cross sectional view taken along line 10b—10b of FIG. 10(a)

FIG. 10(a) is a plan view of a semiconductor optical sensing apparatus according to a tenth embodiment of the invention. FIG. 10(b) is a cross sectional view taken along line 10b—10b of FIG. 10(a). The semiconductor optical sensing apparatus according to the tenth embodiment has an external appearance as shown in FIG. 19(a).

The semiconductor optical sensing apparatus according to the tenth embodiment has a structure, to which a thin film 10 for covering the openings 1a and 1b is added to the back surface of the plastic casing 1, according to the first embodiment. The thin film 10 prevents moisture and foreign substances from coming into the transparent silicone gel 7 to protect the transparent silicone gel 7 filled in the casing 1.

The portions of the thin film 10 facing the openings 1a and 1b rise or sink in response to the contraction or expansion of the transparent silicone gel 7. The thin film 10 is made of rubber, plastics, synthetic resin, or such elastic material. Preferably, the thin film 10 is treated, e.g. painted with black, so that it may block light. The plastic casing 1, a transparent plate 5 and focusing means 6 are made of the same material or materials having almost the same thermal expansion coefficients.

The focusing means 6 may be shaped with a parallelepiped plate form. In this case, the semiconductor optical sensing apparatus has an external appearance as shown in FIG. 19(b).

Figure 11A:
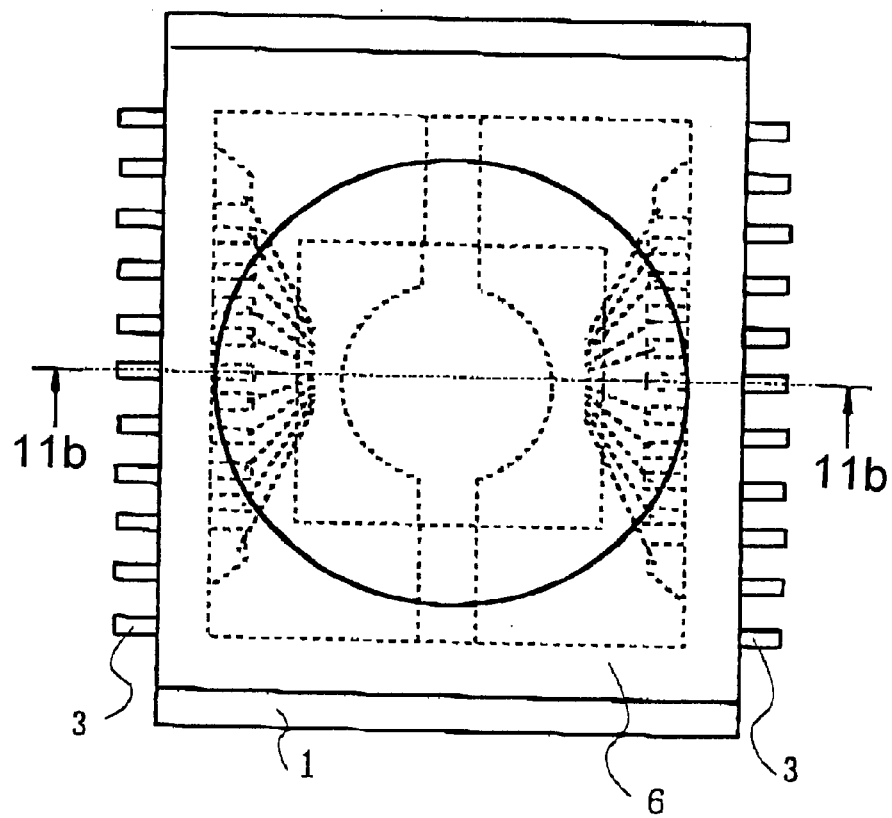
FIG. 11(a) is a plan view of a semiconductor optical sensing apparatus according to an eleventh embodiment of the invention.
Figure 11B:
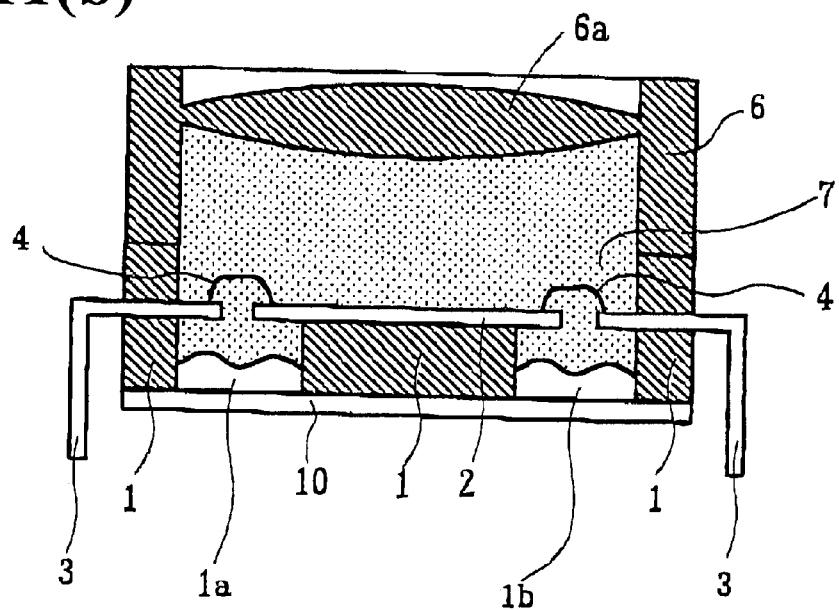
FIG. 11(b) is a cross sectional view taken along line 11b—11b of FIG. 11(a)

FIG. 11(a) is a plan view of a semiconductor optical sensing apparatus according to an eleventh embodiment of the invention. FIG. 11(b) is a cross sectional view taken along line 11b—11b of FIG. 11(a). The semiconductor optical sensing apparatus according to the eleventh embodiment has an external appearance as shown in FIG. 19(c).

The semiconductor optical sensing apparatus according to the eleventh embodiment has a structure essentially the same as that of the sensing apparatus according to the third embodiment. A thin film 10 that covers openings 1a and 1b is formed on the back surface of a plastic casing 1 to prevent moisture and foreign substances from coming into transparent silicone gel 7 so that the transparent silicone gel 7 filled in the casing 1 may be protected.

Focusing means 6 may be shaped with a cylindrical form. In this case, the semiconductor optical sensing apparatus has an external appearance as shown in FIG. 19(d).

Figure 12A:
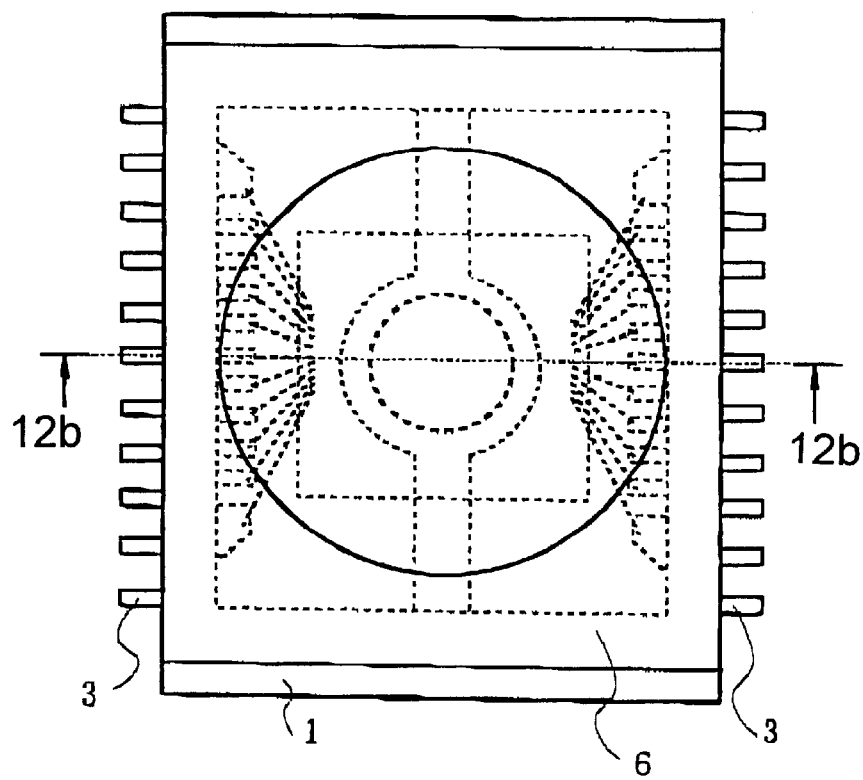
FIG. 12(a) is a plan view of a semiconductor optical sensing apparatus according to a twelfth embodiment of the invention.
Figure 12B:
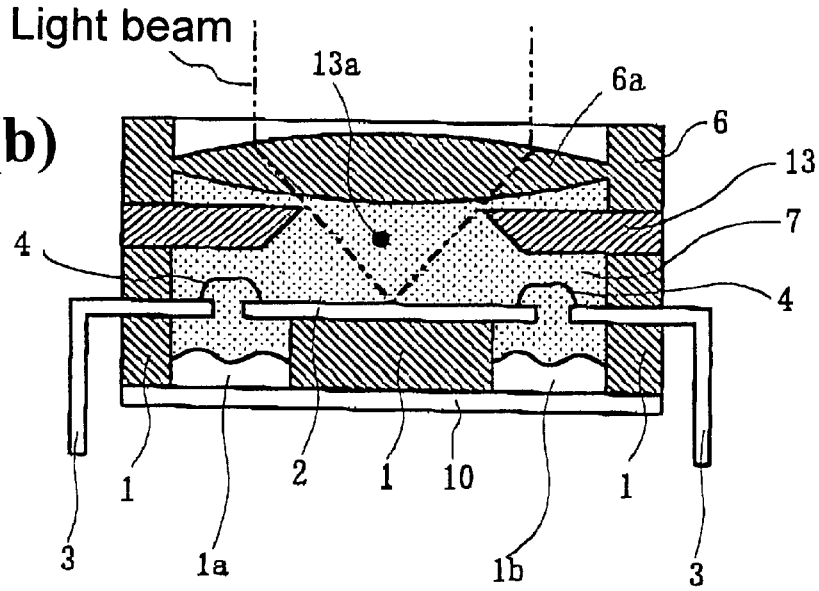
FIG. 12(b) is a cross sectional view taken along line 12b—12b of FIG. 12(a)

FIG. 12(a) is a plan view of a semiconductor optical sensing apparatus according to a twelfth embodiment of the invention. FIG. 12(b) is a cross sectional view taken along line 12b—12b of FIG. 12(a). The semiconductor optical sensing apparatus according to the twelfth embodiment has an external appearance as shown in FIG. 19(b).

The semiconductor optical sensing apparatus according to the twelfth embodiment has a structure essentially the same as that of the sensing apparatus according to the eighth embodiment. A thin film 10 that covers openings 1a and 1b is formed on the back surface of a plastic casing 1 to prevent moisture and foreign substances from coming into transparent silicone gel 7 so that the transparent silicone gel 7 filled in the casing 1 may be protected.

Focusing means 6 may be shaped with a cylindrical form. In this case, the semiconductor optical sensing apparatus has an external appearance as shown in FIG. 19(a).

Figure 13A:
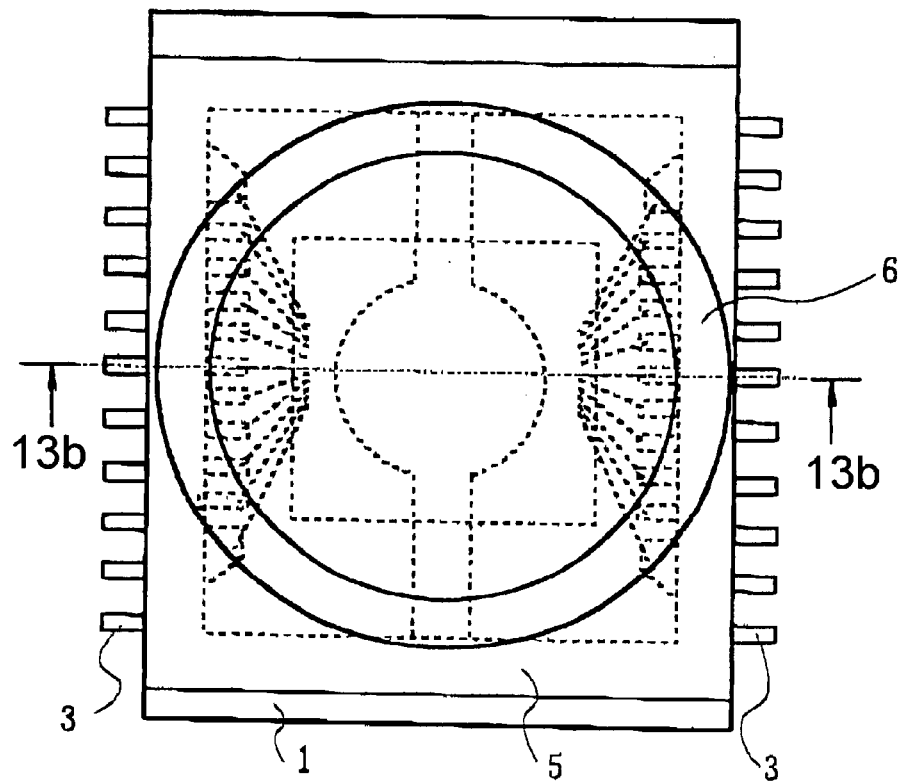
FIG. 13(a) is a plan view of a semiconductor optical sensing apparatus according to a thirteenth embodiment of the invention.
Figure 13B:
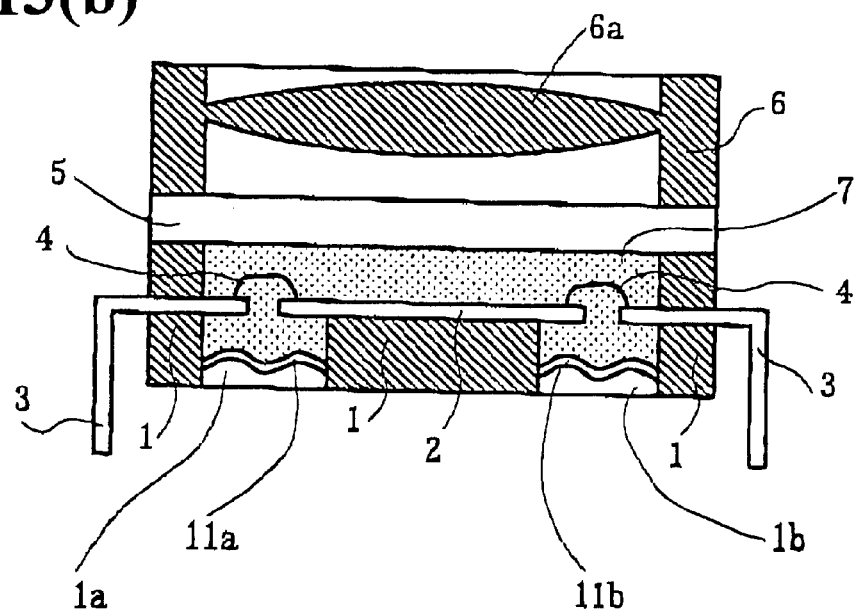
FIG. 13(b) is a cross sectional view taken along line 13b—13b of FIG. 13(a)

FIG. 13(a) is a plan view of a semiconductor optical sensing apparatus according to a thirteenth embodiment of the invention. FIG. 13(b) is a cross sectional view taken along line 13b—13b of FIG. 13(a). The semiconductor optical sensing apparatus according to the thirteenth embodiment has an external appearance as shown in FIG. 19(a).

The semiconductor optical sensing apparatus according to the thirteenth embodiment has a structure to which coating films 11a and 11b are added to the semiconductor optical sensing apparatus according to the first embodiment. The coating films 11a and 11b are coated on the surfaces of transparent silicone gel 7 in the respective openings 1a and 1b. The coating films 11a and 11b are made of silicone rubber, synthetic resin or such a material that are less hygroscopic and harder after its curing than the transparent silicone gel 7.

The coating films 11a and 11b move up and down in response to the contraction and expansion of the transparent silicone gel 7 and prevent moisture and foreign substances from coming into the transparent silicone gel 7 so that the transparent silicone gel 7 filled in the casing 1 may be protected. The plastic casing 1, a transparent plate 5 and focusing means 6 are made of the same material or materials having almost the same thermal expansion coefficients.

The focusing means 6 may be shaped with a parallelepiped plate form. In this case, the semiconductor optical sensing apparatus has an external appearance as shown in FIG. 19(b).

Figure 14A:
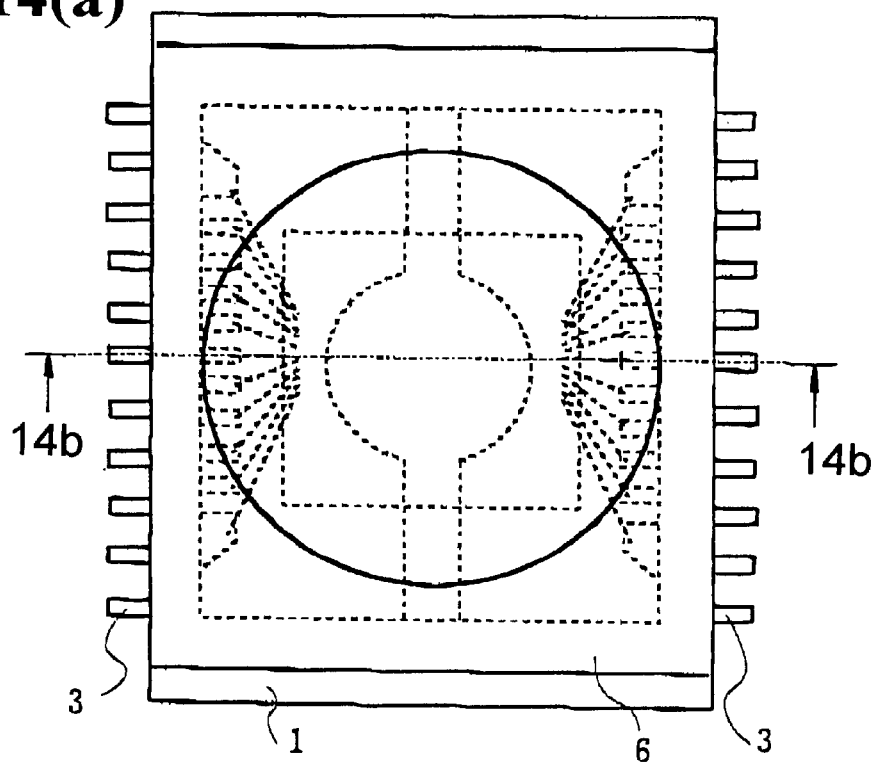
FIG. 14(a) is a plan view of a semiconductor optical sensing apparatus according to a fourteenth embodiment of the invention.

FIG. 14(a) is a plan view of a semiconductor optical sensing apparatus according to a fourteenth embodiment of the invention.

Figure 14B:
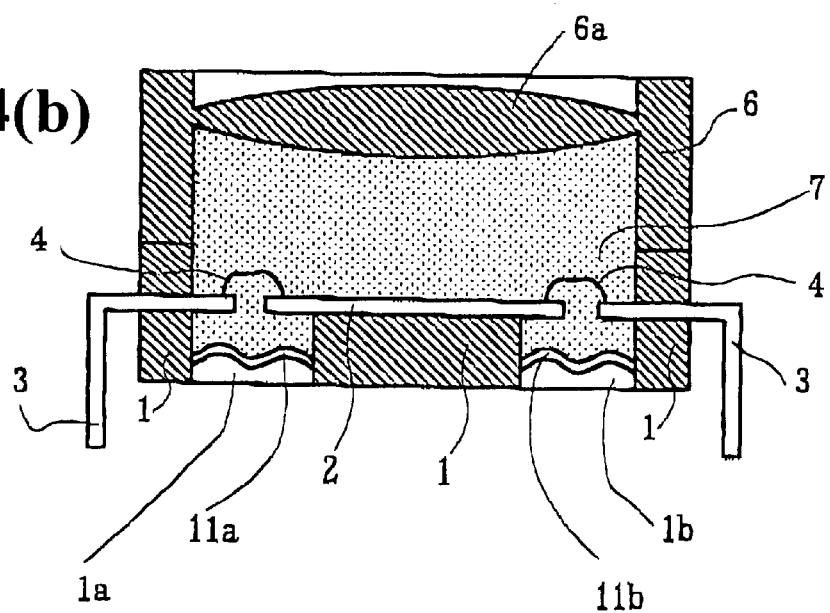
FIG. 14(b) is a cross sectional view taken along line 14b—14b of FIG. 14(a)

FIG. 14(b) is a cross sectional view taken along line 14b—14b of FIG. 14(a). The semiconductor optical sensing apparatus according to the fourteenth embodiment has an external appearance as shown in FIG. 19(c).

The semiconductor optical sensing apparatus according to the fourteenth embodiment has a structure to which coating films 11a and 11b are added to the semiconductor optical sensing apparatus according to the third embodiment. The coating films 11a and 11b are coated on the surfaces of transparent silicone gel 7 in respective openings 1a and 1b. The coating films 11a and 11b are made of silicone rubber, synthetic resin or such a material that are less hygroscopic and harder after its curing than the transparent silicone gel 7.

A plastic casing 1 and focusing means 6 are made of the same material or materials having almost the same thermal expansion coefficients.

The focusing means 6 may be shaped with a cylindrical form.

In this case, the semiconductor optical sensing apparatus has an external appearance as shown in FIG. 19(d).

Figure 15A:
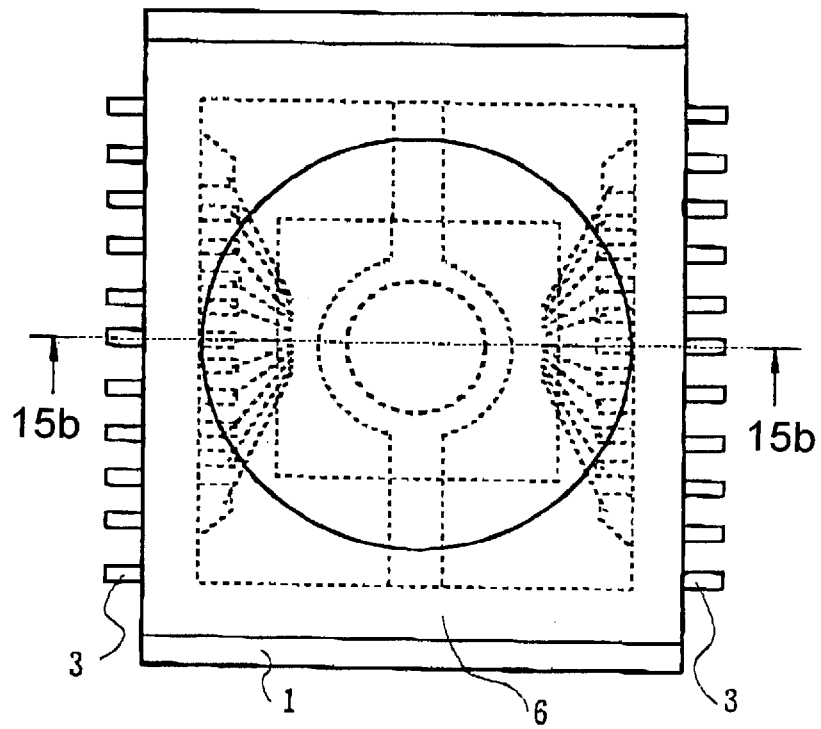
Figure 15B:
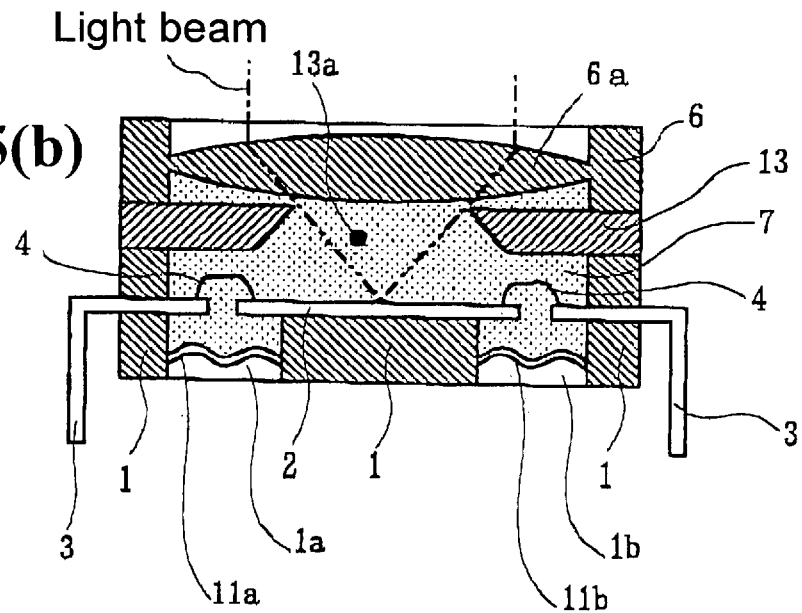

FIG. 15(a) is a plan view of a semiconductor optical sensing apparatus according to a fifteenth embodiment of the invention. FIG. 15(b) is a cross sectional view taken along line 15b—15b of FIG. 14(a). The semiconductor optical sensing apparatus according to the fifteenth embodiment has an external appearance as shown in FIG. 19(b).

The semiconductor optical sensing apparatus according to the fifteenth embodiment has a structure in which coating films 11a and 11b are added to the semiconductor optical sensing apparatus according to the eighth embodiment. The coating films 11a and 11b are coated on the surfaces of transparent silicone gel 7 in the respective openings 1a and 1b. The coating films 11a and 11b are made of silicone rubber, synthetic resin or such a material that is less hygroscopic and harder after its curing than the transparent silicone gel 7.

A plastic casing 1 and focusing means 6 are made of the same material or materials having almost the same thermal expansion coefficients.

The focusing means 6 may be shaped with a cylindrical form. In this case, the semiconductor optical sensing apparatus has an external appearance as shown in FIG. 19(a).

Figure 16A:
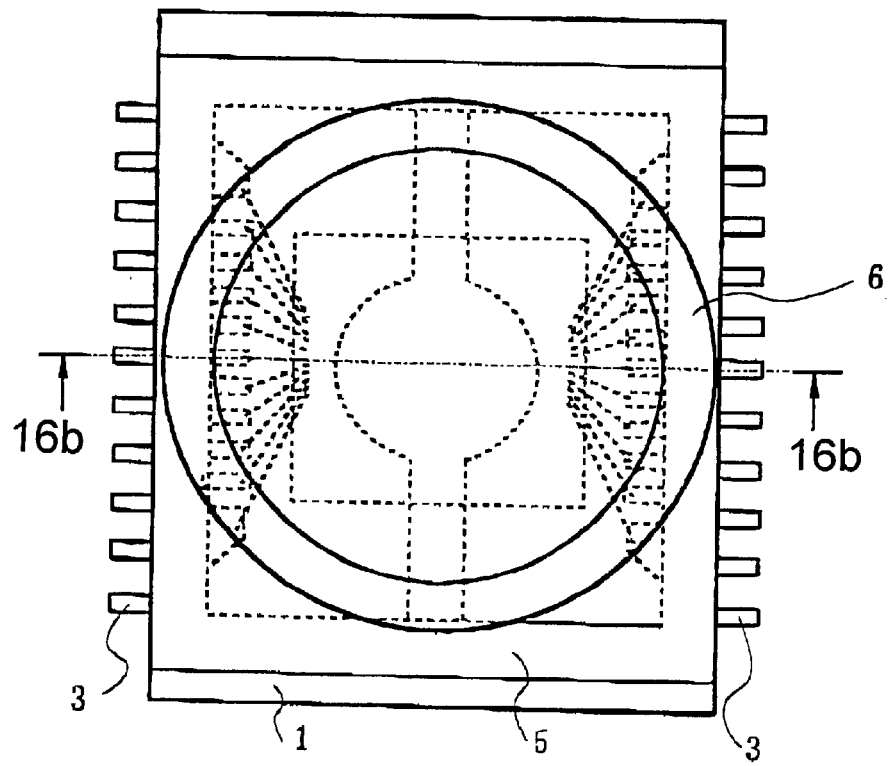
FIG. 16(a) is a plan view of a semiconductor optical sensing apparatus according to a sixteenth embodiment of the invention.
Figure 16B:
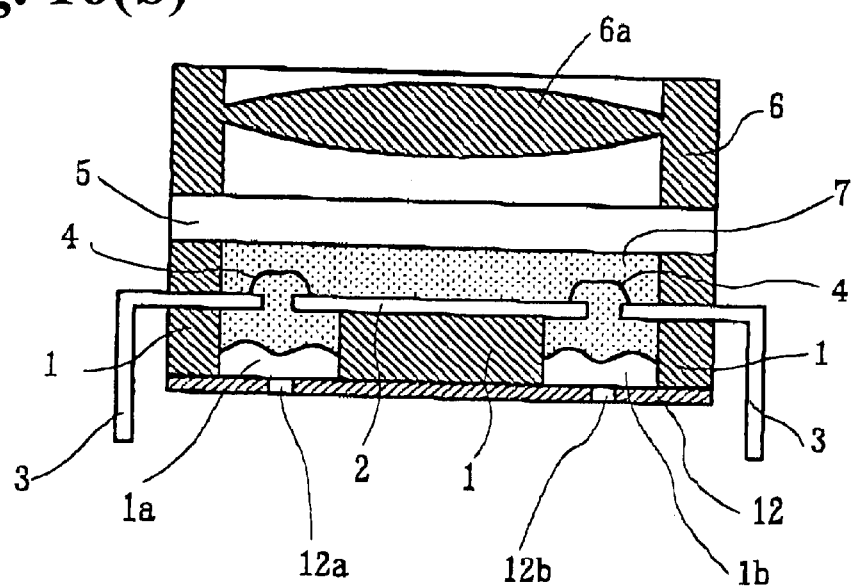
FIG. 16(b) is a cross sectional view taken along line 16b—16b of FIG. 16(a)

FIG. 16(a) is a plan view of a semiconductor optical sensing apparatus according to a sixteenth embodiment of the invention. FIG. 16(b) is a cross sectional view taken along line 16b—16b of FIG. 16(a). The semiconductor optical sensing apparatus according to the sixteenth embodiment has an external appearance as shown in FIG. 19(b).

The semiconductor optical sensing apparatus according to the sixteenth embodiment has a structure in which a protector plate 12 is added on the back surface of a plastic casing 1 according to the first embodiment. The protector plate 12 includes bores 12a and 12b bored corresponding to respective openings 1a and 1b. For protecting transparent silicone gel 7, the cross sectional areas of the bores 12a and 12b are narrow enough to prevent moisture and foreign substances from coming into the transparent silicone gel 7. The plastic casing 1, a transparent plate 5 and focusing means 6 are made of the same material or materials having almost the same thermal expansion coefficients.

The focusing means 6 may be shaped with a parallelepiped plate form. In this case, the semiconductor optical sensing apparatus has an external appearance as shown in FIG. 19(b).

Figure 17A:
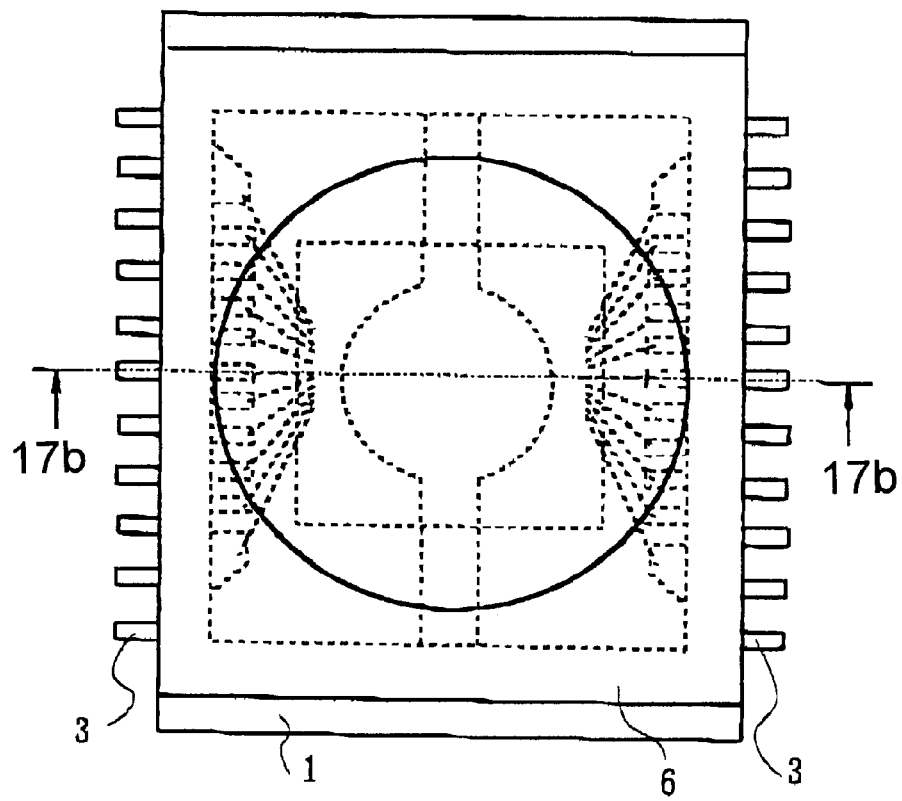
FIG. 17(a) is a plan view of a semiconductor optical sensing apparatus according to a seventeenth embodiment of the invention.
Figure 17B:
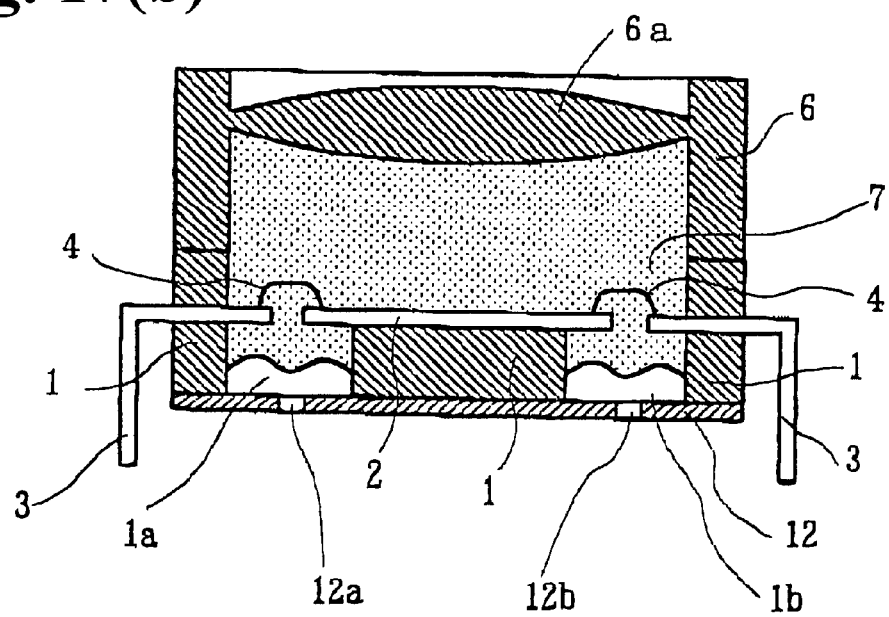
FIG. 17(b) is a cross sectional view taken along line 17b—17b of FIG. 17(a)

FIG. 17(a) is a plan view of a semiconductor optical sensing apparatus according to a seventeenth embodiment of the invention. FIG. 17(b) is a cross sectional view taken along line 17b—17b of FIG. 17(a). The semiconductor optical sensing apparatus according to the seventeenth embodiment has an external appearance as shown in FIG. 19(b).

The semiconductor optical sensing apparatus according to the seventeenth embodiment has a structure, in which a protector plate 12 is added on the back surface of the plastic casing 1 according to the third embodiment. A plastic casing 1 and focusing means 6 are made of the same material or materials having almost the same thermal expansion coefficients.

The focusing means 6 may be shaped with a cylindrical form. In this case, the semiconductor optical sensing apparatus has an eternal appearance as shown in FIG. 19(d).

Figure 18A:
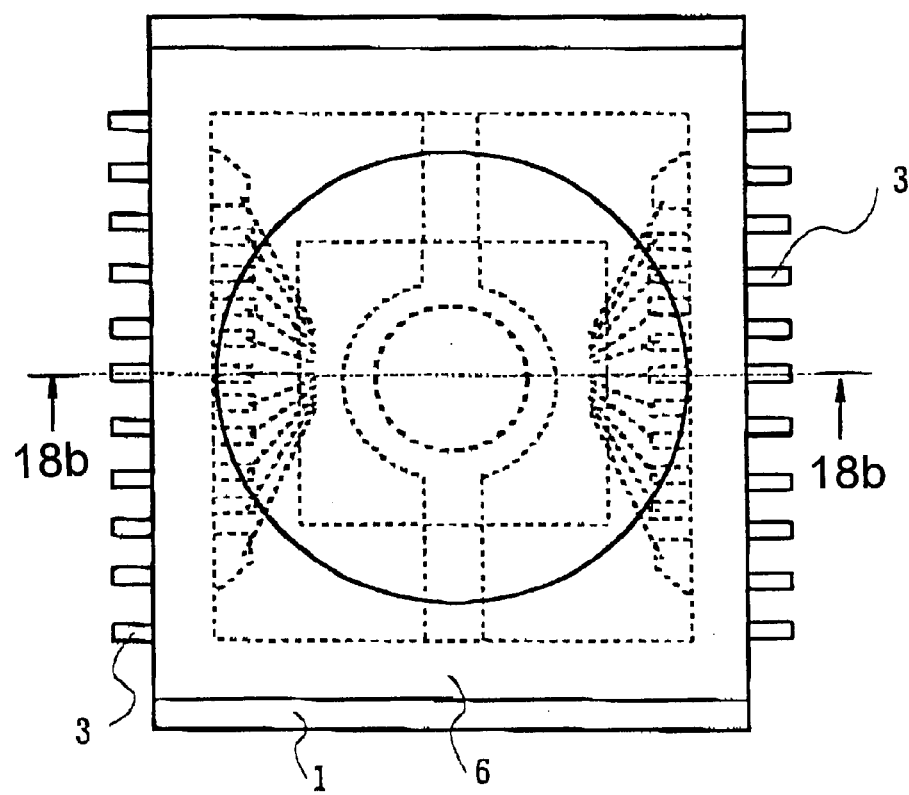
FIG. 18(a) is a plan view of a semiconductor optical sensing apparatus according to an eighteenth embodiment of the invention.
Figure 18B:
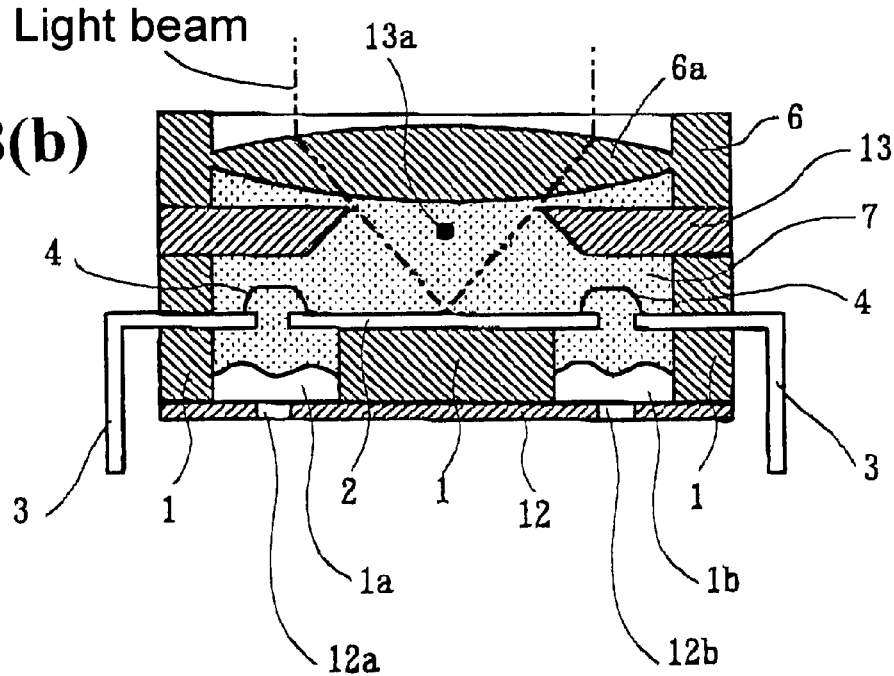
FIG. 18(b) is a cross sectional view taken along line 18b—18b of FIG. 18(a)

FIG. 18(a) is a plan view of a semiconductor optical sensing apparatus according to an eighteenth embodiment of the invention. FIG. 18(b) is a cross sectional view taken along line 18b—18b of FIG. 18(a). The semiconductor optical sensing apparatus according to the eighteenth embodiment has an external appearance as shown in FIG. 19(b).

The semiconductor optical sensing apparatus according to the eighteenth embodiment has a structure, in which a protector plate 12 is added on the back surface of the plastic casing 1 according to the eighth embodiment. A plastic casing 1 and focusing means 6 are made of the same material or materials having almost the same thermal expansion coefficients.

The focusing means 6 may be shaped with a cylindrical form. In this case, the semiconductor optical sensing apparatus has an external appearance as shown in FIG. 19(a).

The metal die pad 8 may be disposed in the bonding position of the plastic casing 1 in which the sensor chip 2 is bonded, according to the tenth through eighteenth embodiments.

The supporting rods 9 may be added to the plastic casing 1 in the tenth through eighteenth embodiments to provide the optical semiconductor sensing device with an additional opening or additional openings 1d.

Although not illustrated, it is preferable to dispose a thin film, a coating film or a protector plate on the transparent silicone gel 7 in each opening 1d so that moisture and foreign substances may be prevented from entering into the transparent silicone gel 7.

The present invention is applicable to the surface-mount-type casing, the inner space of which is filled with a transparent filler. The transparent filler is not limited to the transparent silicone gel described above. For example, transparent silicone rubber and transparent synthetic resin may be used as the transparent filler. The casing may be made of other materials, such as ceramics and a composite of ceramics and plastics.

The plastic casings according to the first through eighteenth embodiments are manufactured by injection molding of a thermoplastic resin. The plastic casings may be made also by die-casting of epoxy resin or such thermosetting resin. The connecting means for connecting the internal terminals on the semiconductor optical sensor chip to the wiring pattern of the insulative casing is not limited to the bonding wires described above. Connections by controlled collapse bonding are also applicable to connect the internal terminals on the semiconductor optical sensor chip to the wiring pattern of the insulative casing.

Cycloolefin polymer, generally called "CPO", is preferable for the plastic materials of the constituent elements. As examples of the combination of the materials having almost the same thermal expansion coefficients, the transparent plate 5 and the focusing means 6 are made of transparent cycloolefin polymer and the plastic casing 1 is made of cycloolefin polymer, to which a pigment is mixed. Thus, modifications will be obvious to those skilled in the art without departing the subject of the invention.

As described above, the semiconductor optical sensing apparatus according to the invention improves its stability against temperature change, prevents deterioration and variation of the optical characteristics, elongates the life of the apparatus and provides the apparatus with high reliability.

What is claimed is:
1. A semiconductor optical sensing apparatus comprising:
a casing made of an electrically insulative material and having a bottom portion and at least one opening at the bottom portion;

wiring means extending from an inside to an outside of the casing;

a semiconductor optical sensor chip bonded to the bottom portion of the casing and having a terminal on a surface thereof;

connecting means connecting the terminal and the wiring means;

a transparent filler filled in a space inside the casing to cover the sensor chip, said at least one opening absorbing a volume change of the transparent filler caused by expansion or contraction thereof;

focusing means connected to the casing and located at a position to focus an image on the semiconductor optical sensor chip, said focusing means having a frame and a lens situated inside the frame and integrally formed therewith, said frame being located above the casing; and an iris plate disposed between the frame of the focusing means and the casing so that said transparent filler is filled completely between the lens and the sensor chip inside the casing and the frame with the iris plate therein, said iris plate, said focusing means and said casing being made of materials having thermal expansion coefficients, which are at least substantially same.

2. A semiconductor optical sensing apparatus according to claim 1, wherein said iris plate is disposed above the sensor chip with the transparent filler interposed in-between, said iris plate limiting light beams entering the sensor chip.

3. A semiconductor optical sensing apparatus according to claim 2, wherein said focusing means includes at least a pair of lenses, and said iris plate has apertures correspondence to the lenses.

4. A semiconductor optical sensing apparatus according to claim 1, further comprising covering means for covering said transparent filler in said at least one opening.

5. A semiconductor optical sensing apparatus according to claim 1, further comprising coating means for coating said transparent filler in said at least one opening.

6. A semiconductor optical sensing apparatus according to claim 1, further comprising protecting means for protecting said transparent filler in said at least one opening.

7. A semiconductor optical sensing apparatus according to claim 1, wherein said transparent filler comprises transparent silicone gel.

* * * * *

UNITED STATES PATENT AND TRADEMARK OFFICE
CERTIFICATE OF CORRECTION

PATENT NO.   : 6,627,872 B1
DATED        : September 30, 2003
INVENTOR(S)  : Hajime Fukamura et al.

It is certified that error appears in the above-identified patent and that said Letters Patent is hereby corrected as shown below:

Column 12,
Line 39, change "thermally openings" to -- thermally. Openings --;

Column 14,
Line 60, change "that are" to -- that is --;
Line 67, delete space after "form.";

Column 15,
Line 1, delete new paragraph and continue to end of the last line of
Column 14;
Line 65, change "eternal" to -- external --;

Column 18,
Line 9, after "apertures" add -- in --.

Signed and Sealed this

Seventeenth Day of February, 2004

JON W. DUDAS
*Acting Director of the United States Patent and Trademark Office*